(12) United States Patent
Saito et al.

(10) Patent No.: US 7,764,564 B2
(45) Date of Patent: Jul. 27, 2010

(54) SEMICONDUCTOR DEVICE

(75) Inventors: Hideaki Saito, Tokyo (JP); Hiroaki Ikeda, Tokyo (JP)

(73) Assignees: NEC Corporation, Tokyo (JP); Elpida Memory, Inc., Tokyo (JP)

( * ) Notice: Subject to any disclaimer, the term of this patent is extended or adjusted under 35 U.S.C. 154(b) by 270 days.

(21) Appl. No.: 11/987,501

(22) Filed: Nov. 30, 2007

(65) Prior Publication Data

US 2008/0133809 A1 Jun. 5, 2008

(30) Foreign Application Priority Data

Dec. 4, 2006 (JP) ............................. 2006-326746

(51) Int. Cl.
*G11C 8/00* (2006.01)
(52) U.S. Cl. ............................. 365/230.03; 365/189.04; 365/189.08
(58) Field of Classification Search ............ 365/230.03, 365/189.04, 189.08, 185.14, 189.01, 189.03, 365/190

See application file for complete search history.

(56) References Cited

U.S. PATENT DOCUMENTS

| 6,504,742 | B1 | 1/2003 | Tran et al. | |
| 7,542,359 | B2 * | 6/2009 | Shibata et al. | 365/200 |
| 2005/0286286 | A1 | 12/2005 | Saito et al. | |
| 2006/0067148 | A1 * | 3/2006 | Kurosaki | 365/207 |
| 2007/0055917 | A1 * | 3/2007 | Kashiwaya | 714/49 |

FOREIGN PATENT DOCUMENTS

| JP | 04-196263 | 7/1992 |
| JP | 2002-026283 A | 1/2002 |
| JP | 2003-209222 A | 7/2003 |
| JP | 2006-013337 A | 1/2006 |

* cited by examiner

*Primary Examiner*—Dang T Nguyen
(74) *Attorney, Agent, or Firm*—Foley & Lardner LLP

(57) ABSTRACT

A semiconductor device, which allows a bank interleaving operation by issuing a write command and a read command to different banks while switching them without a waiting time to thereby prevent a drop in data transfer efficiency, is provided. The semiconductor device includes: a memory chip with banks each including at least one memory cell; a logic chip; and data buses, provided corresponding to the banks, for transmitting/receiving write data and read data between the banks and the logic chip. The logic chip includes: a writing data bus for transmitting write data to the memory chip via a data bus; a reading data bus for receiving read data from the memory chip via a data bus; and a switch for, corresponding to a write command or a read command to a bank, connecting the writing data bus or the reading data bus to a data bus connected to the bank.

2 Claims, 19 Drawing Sheets

FIG. 16
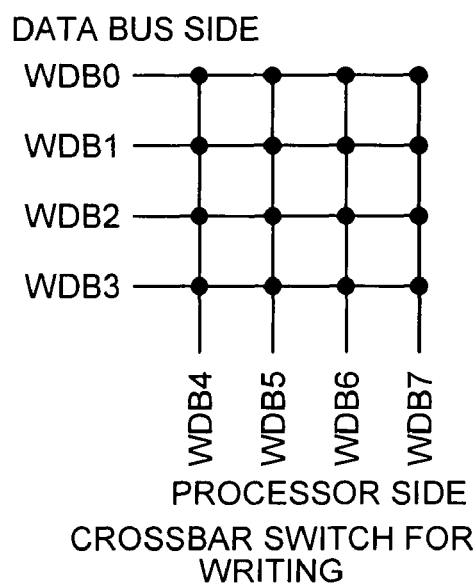
DATA BUS SIDE
PROCESSOR SIDE
CROSSBAR SWITCH FOR WRITING
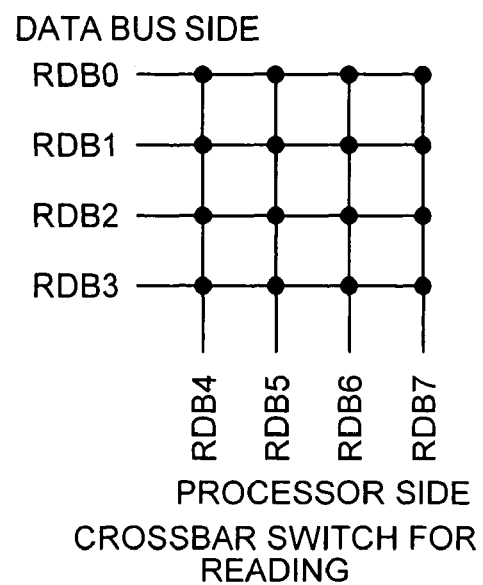
DATA BUS SIDE
PROCESSOR SIDE
CROSSBAR SWITCH FOR READING

US 7,764,564 B2

SEMICONDUCTOR DEVICE

CROSS-REFERENCE TO RELATED APPLICATIONS

This application is based upon and claims the benefit of priority from Japanese patent application No. 2006-326746, filed on Dec. 4, 2006, the disclosure of which is incorporated herein in its entirety by reference.

BACKGROUND OF THE INVENTION

1. Field of the Invention

The present invention relates to a semiconductor device capable of improving access efficiency of a semiconductor memory such as a DRAM in particular.

2. Description of Related Art

As a technology to miniaturize and highly-integrate a semiconductor integrated circuit develops, memories such as DRAMs (dynamic random access memory) and SRAMs (static random access memory) become to have larger capacities. However, since miniaturization of a semiconductor has a limit, there is a demand to introduce a new technology to realize a larger capacity. As such a technology, a three-dimensional semiconductor in which semiconductor chips are stacked has been proposed.

Japanese Patent Application Laid-Open No. 4-196263 (Patent Document 1) discloses a measure to realize a large-scale integrated circuit by laminating semiconductor chips so as not to change the chip area, in which memory circuits are integrated on another chip stacked on the main body of the semiconductor integrated circuit. Japanese Patent Applications Laid-Open No. 2002-26283 (Patent Document 2), No. 2003-209222 (Patent Document 3), and No. 2006-13337 (Patent Document 4) disclose a multilayered memory structure in which memory cell arrays are multilayered to realize a larger capacity.

Patent Document 2 describes a multilayered memory chip in which memory peripheral circuits are not provided to the respective chips but are integrated on one chip so that the regions of the peripheral circuits occupied in the chip area are reduced. Patent Document 3 describes an invention in which after a multilayered memory device is manufactured, the memory layers are screened, so that defective memory layers can be eliminated. Patent Document 4 describes an invention in which the input-output bit structure of a stacked memory is reconstructed by changing the data bus wiring combination.

In each of the stacked-type memory devices described above, it is possible to increase the memory capacity in a limited chip area, but none of them describe how to perform data transfer effectively. Further, as a processor linked to a memory becomes to have higher performance, a memory device is required to have not only larger capacity but also an improvement in transfer efficiency of memory data.

In a general purpose DRAM memory chip, a data bus which is a global wire in the chip surface is shared by banks as shown in FIG. 18, and is a bidirectional bus used for both write data and read data. Therefore, in order to prevent collision of write data and read data on a data bus, a waiting time of several cycles is required between a read command and a write command not only for the case of the same bank but also for the case of different banks. This causes a drop in data transfer efficiency between a processor and a DRAM memory, so there is a need to suspend data processing in the processor. This problem is also caused in the case where a plurality of devices in which DRAM chips are packaged are arranged on a board to share a bus, as shown in FIG. 19.

In order to prevent this problem, a semiconductor memory may be configured such that an input unit for write data and an output unit for read data are provided separately, and respective banks share data buses which are separated for write data and read data. Thereby, write data and read data pass different buses, so no waiting time is needed between a read command and a write command.

However, with such a configuration in which data buses for read data and write data are provided separately, the number of wires for data doubles. In the case of a memory device in which chips are stacked, a via wire which is a wire penetrating chips is used for inter-chip wiring, but the diameter of the wire is 20 μm, which is larger than that of an in-plane wire by a digit or more, because the via wire is so formed that an aperture penetrating up to about 50 μm thick of a chip thin film is made and a conductor for wiring is filled in. Therefore, it is impossible to form a large number of via wires in a limited area, so it is desired to use a common data bus for both write data and read data so as to reduce the density of via wires.

SUMMARY OF THE INVENTION

The present invention has been developed to solve the problems described above, and an exemplary object of the present invention is to provide a semiconductor device which allows a bank interleaving operation by issuing a write command and a read command to different banks while switching them without causing a waiting time to thereby prevent a drop in data transfer efficiency.

In order to achieve the exemplary object, a semiconductor device according to an exemplary aspect of the invention includes: a memory chip with a plurality of banks each of which includes at least one memory cell; a logic chip which transmits a write command and write data to the memory chip, and transmits a read command to the memory chip and receives read data from the memory chip; and data buses, provided corresponding to the banks, for transmitting and receiving the write data and the read data between the banks and the logic chip. The logic chip includes: a writing data bus for transmitting the write data to the memory chip via one of the data buses; a reading data bus for receiving the read data from the memory chip via one of the data buses; and a switch for, corresponding to a write command or a read command issued to one of the banks, connecting the writing data bus or the reading data bus to a data bus connected to the bank.

According to an exemplary aspect of the invention, the logic chip includes a writing data bus and a reading data bus. When data is read from a bank of the memory chip, a data bus is connected to the reading data bus by switching, and when data is written to a bank of the memory chip, a data bus is connected to the writing data bus by switching. Since write data and read data are transmitted through different buses in the logic chip, collision of the write data and the read data can be prevented, so that an interval between writing and reading can be shorter.

Effect of the Invention

As an exemplary advantage according to the invention, a bank interleaving operation can be performed by switching read commands and write commands for all banks in the memory chip without causing a waiting time, while preventing collision of read data and write data on a data bus when pieces of data are transferred between chips.

BRIEF DESCRIPTION OF THE DRAWINGS

FIG. 16 is a schematic diagram showing a crossbar switch of 4 by 4;

EXEMPLARY EMBODIMENT

Hereinafter, an exemplary embodiment of the invention will be described in detail based on the accompanying drawings.

Figure 1:
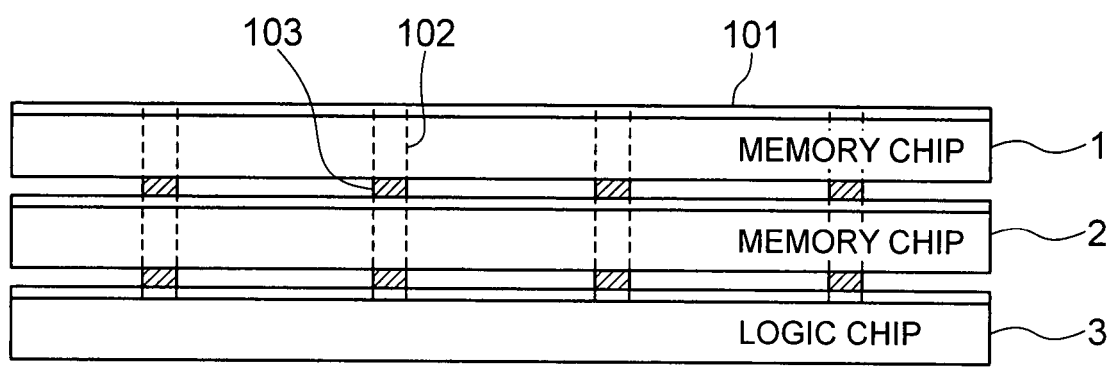
FIG. 1 is a structural sectional view of a semiconductor device in which a stacked memory is stacked on a logic chip in an exemplary embodiment of the invention.
Figure 2:
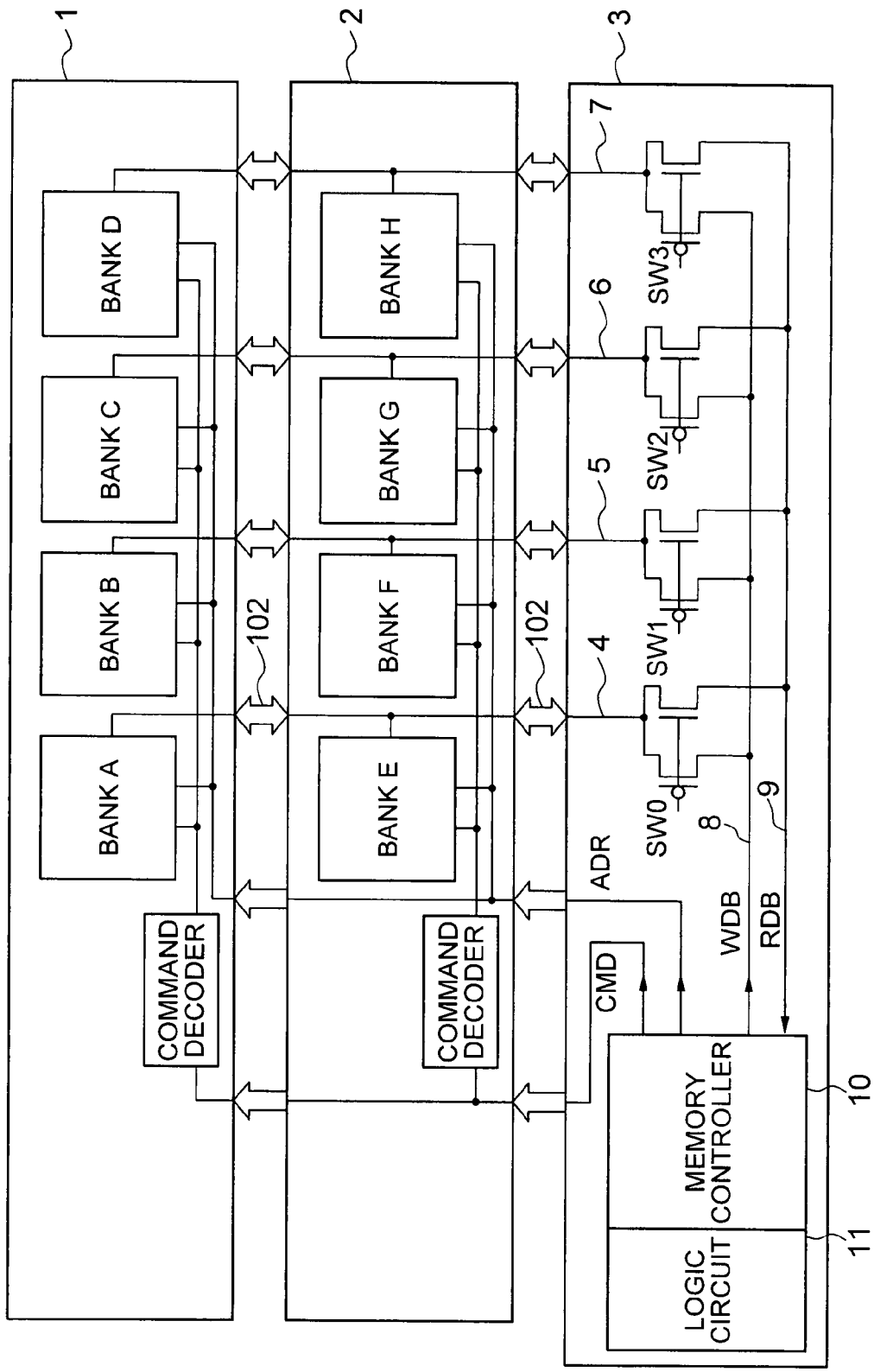
FIG. 2 is a schematic diagram of a semiconductor device in which a stacked memory is stacked on a logic chip in the exemplary embodiment of the invention.

FIG. 1 is a sectional view of a semiconductor device in which a stacked memory, including memory chips 1 and 2 which are stacked, is stacked on a logic chip 3. FIG. 2 is a diagram schematically showing the configuration of the semiconductor device of FIG. 1.

As shown in FIG. 2, the stacked memory is formed such that the memory chip 2 and the memory chip 1 are stacked on the logic chip 3 in this order. The logic chip 3 has a logic circuit 11 which performs computation, and a memory controller 10 which controls the memory chips 1 and 2. As shown in FIG. 1, the surface of each chip is provided with an in-face wiring layer 101. The memory chips 1 and 2 include conductive via wires 102 which penetrate the chips from the upper face to the back face.

As shown in FIG. 2, the storage area of each of the memory chips 1 and 2 in the stacked memory is divided into four banks. Namely, the memory chip 1 includes four banks A to D, and the memory chip 2 includes four banks E to H. Four data buses 4, 5, 6 and 7 are provided for transmitting and receiving data between the logic chip 3 and the banks A to H of the memories 1 and 2 of the stacked memory.

The bank A of the memory chip 1 and the bank E of the memory chip 2 are connected to the data bus 4 of the logic chip 3 by via wires 102 and bumps 103. The bank B of the memory chip 1 and the bank F of the memory chip 2 are connected to the data bus 5 of the logic chip 3 by via wires 102 and bumps 103. The bank C of the memory chip 1 and the bank G of the memory chip 2 are connected to the data bus 6 of the logic chip 3 by via wires 102 and bumps 103. Further, the bank D of the memory chip 1 and the bank H of the memory chip 2 are connected to the data bus 7 of the logic chip 3 by via wires 102 and bumps 103.

Note that although two memory chips 1 and 2 are stacked to form a stacked memory in FIG. 2, the number of memory chips configuring a stacked memory is not limited to that shown in FIG. 2. Further, although the storage area of each of the memory chips 1 and 2 is divided into four banks, the number of banks is not limited to four. Further, although four data buses 4, 5, 6 and 7 are provided in the logic chip 3, the number of data buses is not limited to four. Data buses may be provided in any number which corresponds to the dividing number of the storage area of each of the memory chips 1 and 2.

As described above, the bank A of the memory chip 1 and the bank E of the memory chip 2 share the data bus 4 of the logic chip 3. Similarly, the bank B of the memory chip 1 and the bank F of the memory chip 2 share the data bus 5 of the logic chip 3, the bank C of the memory chip 1 and the bank G of the memory chip 2 share the data bus 6 of the logic chip 3, and the bank D of the memory chip 1 and the bank H of the memory chip 2 share the data bus 7 of the logic chip 3. Although the banks, having a corresponding relationship, in different memory chips share a data bus, a plurality of banks in the same chip do not share a data bus. The via wires 102 are used for transferring data between the memory chips and the data buses 4 to 7. In order to make the wiring density lower, the data buses 4 to 7 are bidirectional buses used for writing data and reading data.

The logic chip 3 includes a writing data bus (WDB) 8 and a reading data bus (RDB) 9, and selector switches SW0 to SW3 which selectively connect the WDB 8 and the RDB 9 to the data buses 4 to 7. By switching the selector switches SW0 to SW3, the connecting destination of each of the writing data bus 8 and the reading data bus 9 is set to one of the data buses 4, 5, 6 and 7, and each of the writing data bus 8 and the reading data bus 9 is connected to one of the banks A and E, the banks B and F, the banks C and G, and the banks D and H of the memory chips 1 and 2 via the data bus 4, 5, 6 or 7 set. When a command is issued from the memory controller 10, one of the selector switches SW0 to SW3 connects the writing data bus 8 or the reading data bus 9 to a data bus connecting to the bank of the memory chips 1 and 2 which are the destination of the command, according to the type of the command. The writing data bus 8 and the reading data bus 9 are connected to the logic circuit 11 via the memory controller 10 which adjusts transfer timing of the command and the data.

For the semiconductor device of the exemplary embodiment, description will be given for the case where the logic circuit 11 issues a read command from the memory controller 10 for the bank A of the memory chip 1 connected to the data bus 4 of the logic chip 3, and immediately after the issuance, the logic circuit 11 issues a write command for the bank F of the memory chip 2 connected to another data bus 5.

Data transaction between the memory controller 10 and the bank A is performed using a path through the data bus 4 and the reading data bus 9. Data transaction between the memory controller 10 and the bank F is performed using a path through the writing data bus 8 and the data bus 5. In this case, the data reading path and the data writing path are different. Note that paths will also be different if a write command is issued first, and immediately after the issuance, a read command is issued to a bank connected to another data bus.

If the data communication paths are different for writing and reading and banks do not share a data bus, write data and read data will not collide with each other, so a waiting time is not needed between issuance of a write command and issuance of a read command. Therefore, commands can be issued continuously.

Further, in the semiconductor device of the exemplary embodiment, when an interleaving operation is performed with banks of different memory chips sharing one data bus, the memory controller 10 may controls as follows. That is, the memory controller 10 controls such that a reading latency in which the read data is transmitted from a bank to the data bus after a read command is issued and a writing latency up to the time that the write data is transmitted to the data bus after the write command is issued become equal.

Thereby, in the case of issuing a read command to the bank A of one memory chip and then continuously issuing a write command to the bank E of another memory chip, or in the case of issuing a write command to the bank A and then continuously issuing a read command to the bank E, it is possible to avoid collision of the read data and the write data on the data bus 4. In the inter-chip wiring, distortion of data waveform is small because the chip is about 50 μm thick and the wire length is very short, so the read data and the write data can be switched in one clock cycle. In other words, it is possible to transmit and receive data with banks while continuously switching and issuing a write command and a read command.

Following the basic configuration of the semiconductor device according to the exemplary embodiment which has been described above, the semiconductor device according to the exemplary embodiment will be described in detail based on specific examples.

First Exemplary Embodiment

As a first exemplary embodiment of the present invention, an example will be described in which a processor is used as a logic chip shown in FIG. 1 and DRAMs are used as memory chips.

Figure 3:
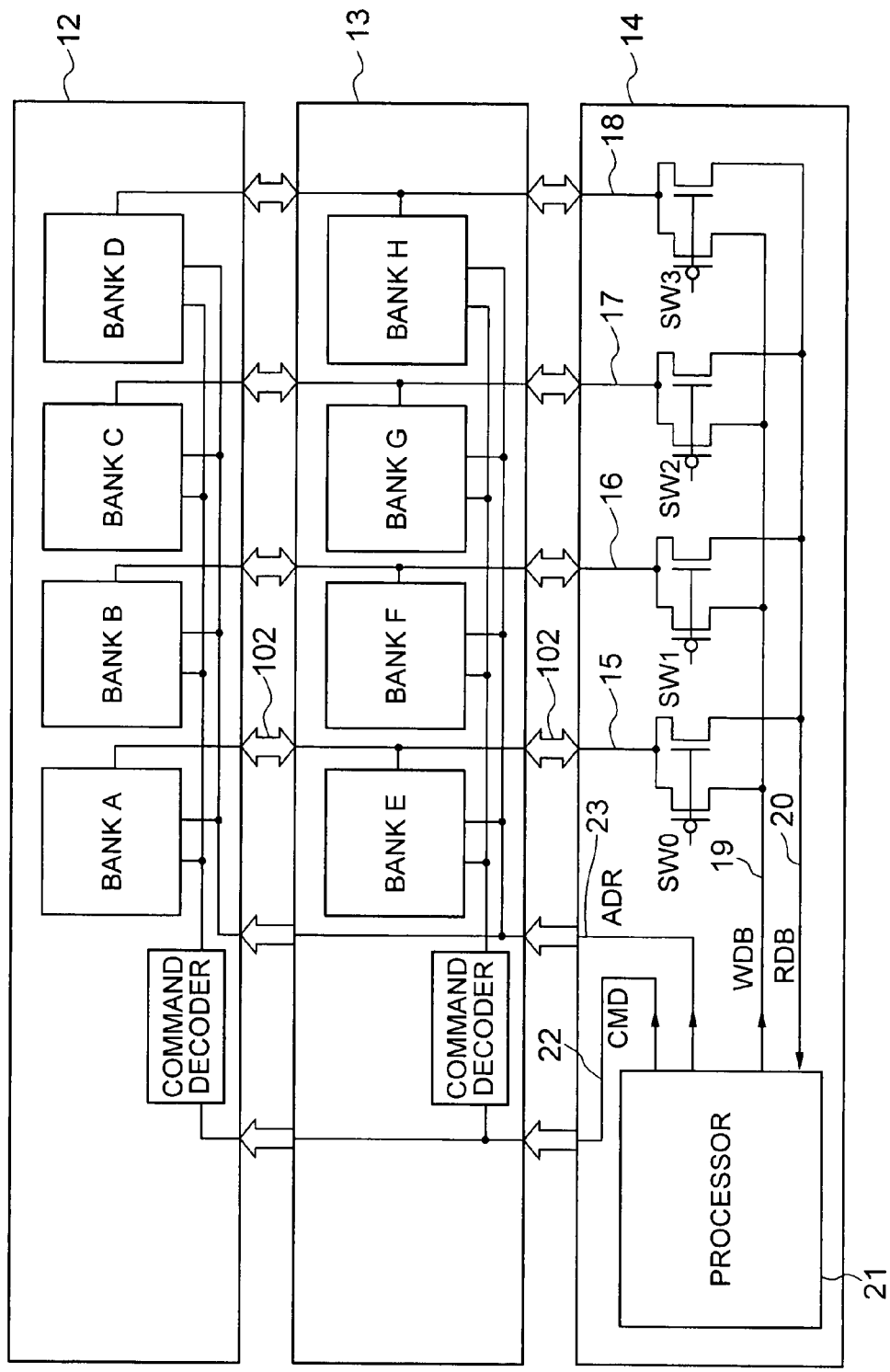
FIG. 3 is a schematic diagram of a stacked-type semiconductor device including a stacked memory and a processor chip of a first exemplary embodiment.

Referring to FIG. 3, a semiconductor device of the first exemplary embodiment includes a stacked memory, and a processor chip 14 which is a logic chip including a processor 21. The stacked memory is formed such that two chips, that is, a DRAM chip 12 and a DRAM chip 13, are stacked, and each DRAM chip includes 4 banks. The DRAM chip 12 includes banks A to D, and the DRAM chip 13 includes banks E to H.

Figure 4:
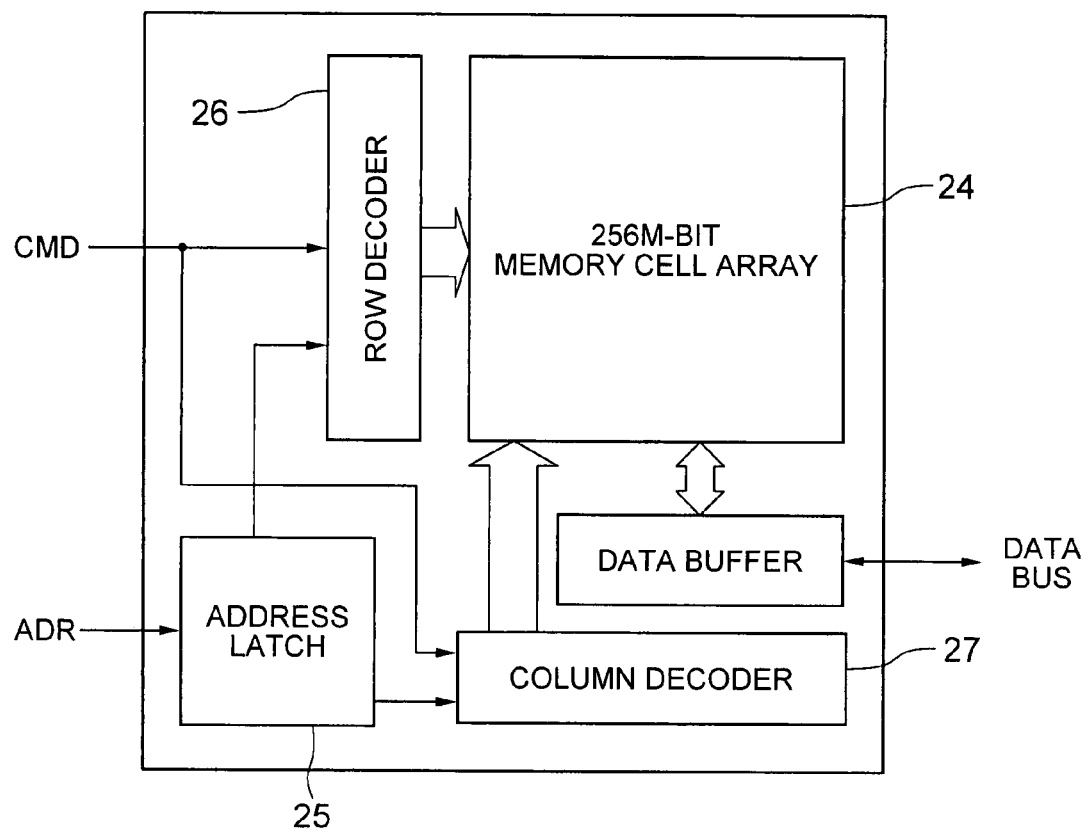
FIG. 4 is a block diagram showing an exemplary configuration of a bank of a DRAM chip.

As shown in FIG. 4, each of the banks A to H includes a 256M-bit memory cell array 24 of, an address latch 25, and address decoders such as a row decoder 26 and a column decoder 27. Therefore, each bank can perform reading and writing operations independently. Although not shown, clocks are input in the address latch and in the data buffer, so transmission of an address to the memory array and input and output of data are operated in synchronization with the clocks. Further, since clocks of the same timing are distributed to the DRAM chips of the stacked memory and the processor chip, transmission and reception of data using a data bus between the DRAM chips and the processor chip can be performed in synchronization with the clocks.

As shown in FIG. 3, in the stacked DRAM chips, the bank A and the bank E share a data bus 15, the bank B and the bank F share a data bus 16, the bank C and the bank G share a data bus 17, and the bank D and the bank H share a data bus 18. Banks in one DRAM chip do not share a data bus in order to avoid a global long wiring which causes a delay in data transfer.

For inter-chip connection of a data bus, a via wire 102 which penetrates a chip is used. Since the thickness of the DRAM chips 12 and 13 is as thin as 50 μm, the via wire 102 is about 50 μm long. Compared with a case of using a global wiring within the chip surface in which the wiring length becomes about 10 mm, the length of the via wire 102 is very short. This allows high-speed data transfer of 10 GHz cycle between chips. However, since the diameter of the via wire 102 is as large as 20 μm so that it is difficult to increase the wiring density, the data bus including the via wire 102 is a bidirectional bus which can be used for both read data and write data.

The stacked memory and the processor chip 14 are connected via four data buses 15 to 18. The processor chip 14 includes a writing data bus (WBS) 19 and a reading data bus (RDB) 20, and selector switches SW0 to SW3 for selectively connecting them to data buses 15 to 18. When a command is issued from the processor 21, one of the selector switches SW0 to SW3 connects the writing data bus 19 or the reading data bus 20 to a data bus which is connected to the destination bank of the command, corresponding to the type of the command. Corresponding to the command issued, one of the data buses is connected to the writing data bus 19 or the reading data bus 20 via one of the selector switches SW0 to SW3. Since two buses are provided in the processor chip 14, input and output of write data from the processor 21 and read data to the processor are separated. The processor 21 also serves as a memory controller.

Between the stacked memory and the processor chip 14, a command bus (CMD) 22 and an address bus (ADR) 23 are connected. An active command to make a bank active, a read command to command reading, and a write command to command writing are transferred in one direction from the processor 21 to the stacked memory, so they are transmitted to all banks A to H through the command bus 22. Address information is also transferred in one direction from the processor 21 to the stacked memory in the same manner as commands, so it is transmitted to all banks A to H through the address bus 23.

Figure 5:
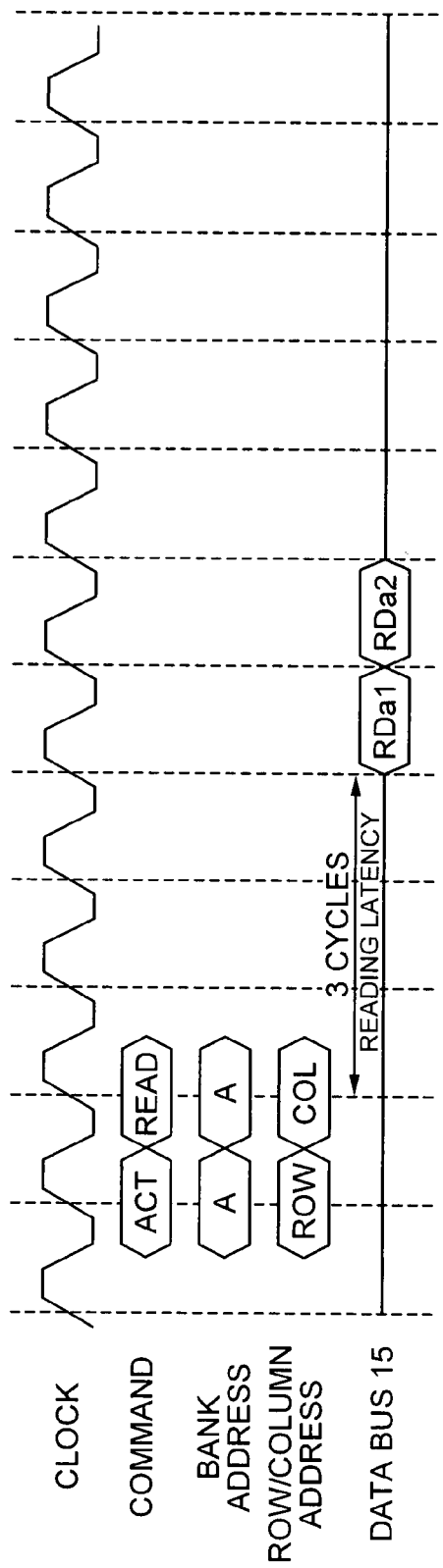
FIG. 5 illustrates an operating mode of reading data according to the first exemplary embodiment.

Next, various operating modes performed between the stacked memory and the processor chip will be described. FIG. 5 shows an operation mode of reading data performed to the memory cell in the bank A of the DRAM chip 12 of the stacked memory shown in FIG. 3.

First, the processor 21 transmits an active command ACT to activate the bank A, and signals of a bank address A for designating the bank A and a row address ROW to the stacked memory. Then, the processor 21 transmits a read command READ, and signals of the bank address A and a column address COL to the stacked memory. When the DRAM chip 12 receives them from the processor 21, the DRAM chip 12 reads 16-bit data RDa1 and 16-bit data RDa2, with the burst length being 2, from a 32-bit memory cell designated by the address in the bank A after 3 clock cycles, and then continuously transmits them to the data bus 15. The data transmitted from the DRAM chip 12 to the data bus 15 is input to the processor 21 in the next clock cycle.

Figure 6:
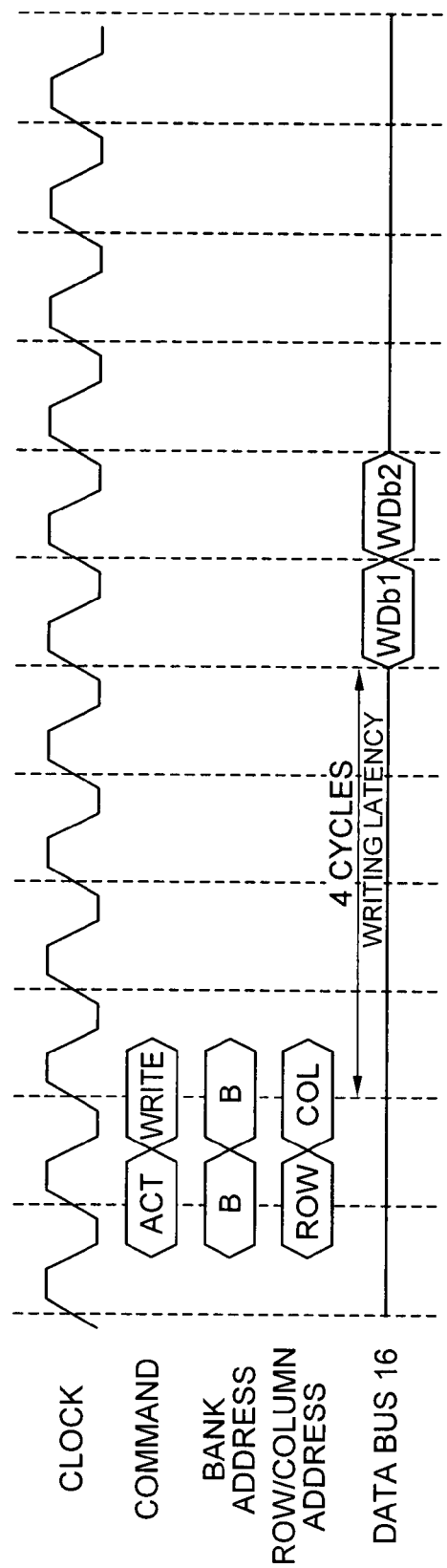
FIG. 6 illustrates an operating mode of writing data according to the first exemplary embodiment.

FIG. 6 shows an operating mode to write data performed to a memory cell in the bank B of the DRAM chip 12 of the stacked memory shown in FIG. 3. First, the processor 21 transmits an active command ACT to activate the bank B, and signals of a bank address B for designating the bank B and a row address ROW to the stacked memory. Then, the processor 21 transmits a write command WRITE, and signals of a bank address B and a column address COL to the stacked memory. Further, as 32-bit write data to be written into the bank B, the processor 21 continuously transmits 16-bit data WDb1 and 16-bit data WDb2, with the burst length being 2, to the bank B of the DRAM chip 12 through the data bus 16 after 4 clock cycles.

Figure 7:
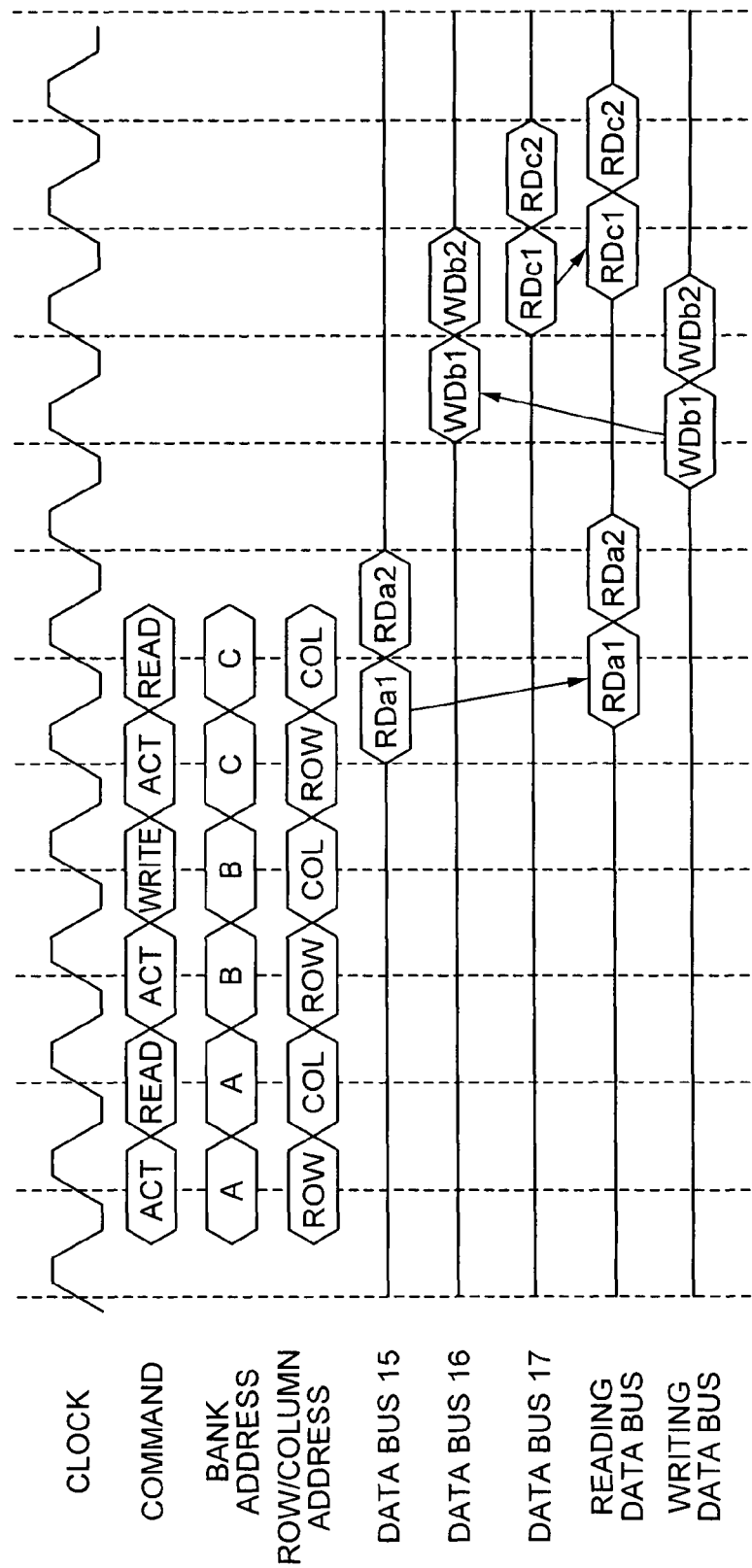
FIG. 7 illustrates an operating mode of bank interleaving for reading and writing according to the first exemplary embodiment.

FIG. 7 shows an interleaving operation mode of reading or writing performed to respective banks using different data buses. The processor 21 issues an active command ACT and a read command READ to the bank A of the DRAM chip 12 of the stacked memory. Then, the processor 21 issues an active command ACT and a write command WRITE to the bank B in the DRAM chip 12 of the stacked memory. Further, the processor 21 issues an active command ACT and a read command READ to the bank C of the DRAM chip 12 of the stacked memory. Note that transmission of signals of row address ROW and column address COL to respective banks is the same as that shown in FIGS. 5 and 6.

Then, the processor 21 operates the selector switch SW1 to connect the writing data bus 19 and the data bus 16, and after 4 cycles from the issuance of a write command to the bank B, the processor 21 transmits write data WDb1 and write data WDb2 to the bank B through the writing data bus 19 and the data bus 16. When the bank B receives the commands and the write data WDb1 and WDb2 from the processor 21, the bank B writes these pieces of data.

Further, the processor 21 operates the selector switches SW0 and SW2 to call the data bus 15 and the data bus 17 to thereby connect them to the data bus 20. When the bank A receives the commands from the processor 21, the bank A reads data, and after 3 cycles from the issuance of the command to the bank A, the bank A transmits the read data RDa1 and RDa2 to the processor 21 through the data bus 15 and the reading data bus 20. On the other hand, when the bank C receives the commands from the processor 21, the bank C reads data, and after three cycles from the issuance of the command for the bank C, the bank C transmits the read data RDc1 and RDc2 to the processor 21 through the data bus 17 and the reading data bus 20. The pieces of data output to the data buses 15 and 17 are transferred to the processor 21 through the reading data bus 20 via the selector switches SW0 and SW2, respectively.

As described above, the read data and the write data can be exchanged between the respective banks and the processor without being collided on the data bus. Therefore no waiting time is caused between issuance of a read command and issuance of a write command in the processor.

Although, in the semiconductor device of the first exemplary embodiment, description is given for the case where an interleaving operation of reading and writing is performed for three banks in the DRAM chip 12, it is possible to perform an interleaving operation by continuously issuing a read command and a write command in the same manner between banks of different chips if the data buses are different.

Further, although the stacked memory is formed of two memory chips being stacked in the first exemplary embodiment, the same operation can be achieved with only one memory chip or a stacked memory in which three or more memory chips are stacked. Further, although the semiconductor device of the first exemplary embodiment has a configuration in which the stacked memory is staked on the processor chip, the same operation can be achieved by arranging the stacked memory and the processor chip distant to thereby perform communications through wires on the board.

Furthermore, although a via wire is used for inter-chip connection of a data bus in the first exemplary embodiment, bump or bonding wire may be used.

Second Exemplary Embodiment

Next, a variation of the semiconductor device shown in FIG. 3 will be described as a second exemplary embodiment.

Figure 8:
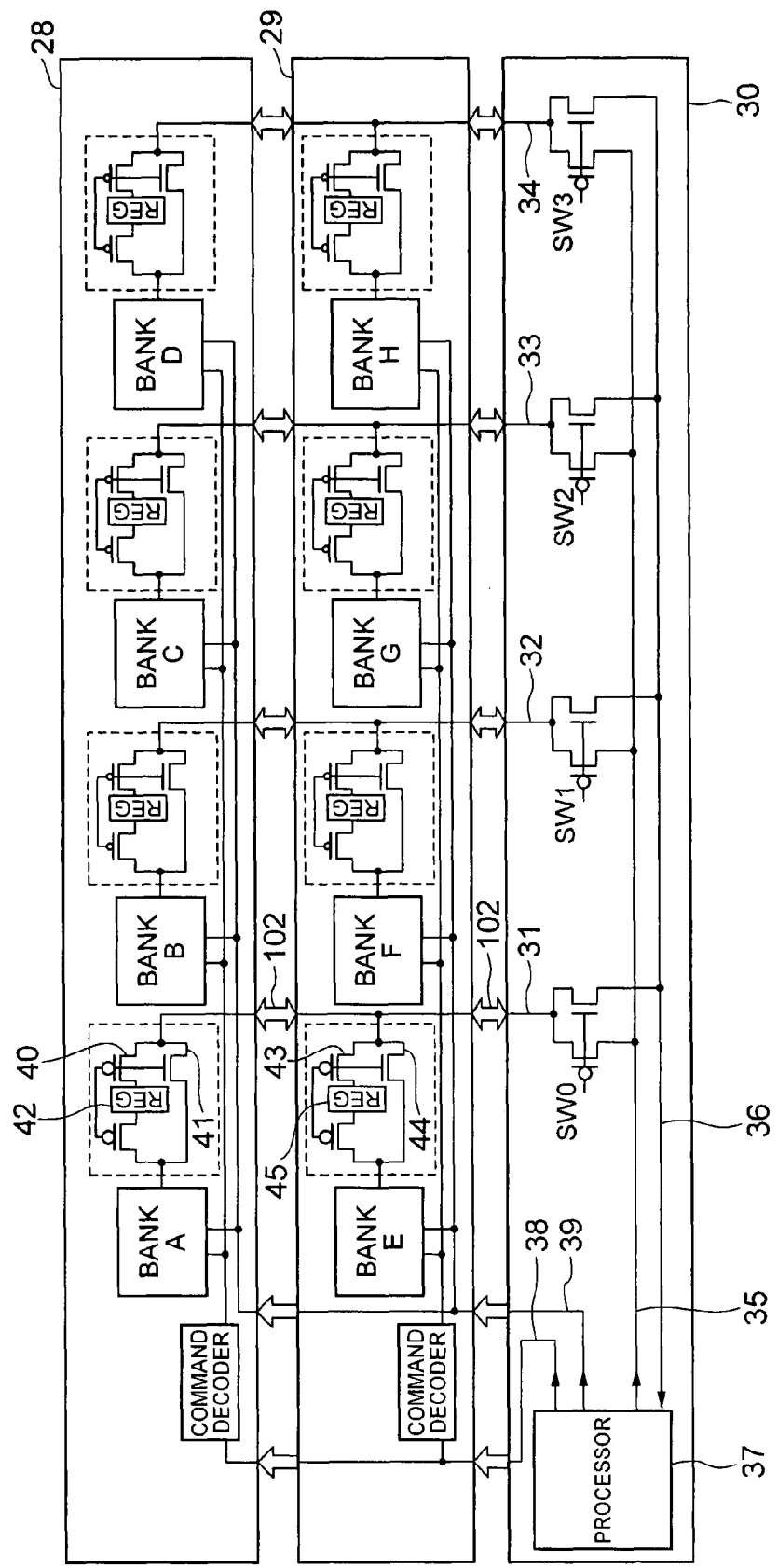
FIG. 8 is a schematic diagram showing a stacked-type semiconductor device including a stacked memory and a processor chip according to a second exemplary embodiment.

Referring to FIG. 8, the semiconductor device of the second exemplary embodiment has a stacked memory and a processor chip 30 which is a logic chip including a processor 37. The stacked memory is formed such that a DRAM chip 28 and a DRAM chip 29 are stacked, and each DRAM chip includes 4 banks. As with the bank shown in FIG. 4, each bank has a 256M-bit memory cell array 24, an address latch 25, and address decoders including a low decoder 26 and a column decoder 27. With this configuration, each bank can perform writing and reading operations independently.

As shown in FIG. 8, in the stacked DRAM chips, a bank A and a bank E share a data bus 31, a bank B and a bank F share a data bus 32, a bank C and a bank G share a data bus 33, and a bank D and a bank H share a data bus 34. Banks in a DRAM chip do not share a data bus in order to avoid a global long wiring which causes a delay in data transfer.

Similar to the first exemplary embodiment, a via wire 102, which is a wire penetrating chips, is used for inter-chip connection of a data bus. Since the thickness of the DRAM chips 28 and 29 is as thin as 50 μm, the via wire 102 is about 50 μm long. Compared with the case of using a global wiring inside a chip surface in which the wiring is about 10 mm long, the via wire 102 is very short, so it is possible to perform high-speed data transfer of 10 GHz cycle between the chips. However, since the diameter of the via wire 102 is as large as 20 μm so that it is difficult to increase the wiring density, the data bus including the via wire 102 is a bidirectional bus which can be used for both read data and write data.

In the second exemplary embodiment, a sub data bus 40 for transmitting write data, a sub data bus 41 for transmitting read data, and a register 42 which is connected to the sub data bus 40 and delays transmission of only write data by prescribed cycles, are provided between a bank and a data bus. The sub data bus 40 is provided with two switches for switching data, flowing between a bank and a data bus, to the sub data bus 40 or to the sub data bus 41, and the sub data bus 41 is provided with one switch. Hereinafter, operation will be described in brief in the case of the bank A shown in FIG. 8.

When data is read from the bank A, the data is transmitted to the data bus 31 through the sub data bus 41. When data is written to the bank A, the data from the data bus 31 is transmitted to the bank A through the sub data bus 40 and the register 42.

The stacked memory and the processor chip 30 are connected via four data buses 31 to 34. As in the case of the first exemplary embodiment, the processor chip 30 is provided with selector switches SW0 to SW3, and each of the data buses 31 to 34 is connected to the writing data bus (WDB) 35 or the reading data bus (RDB) 36 via a selector switch, in accordance with a command issued. By providing two buses in the processor chip 30, input and output of write data from the processor 37 and read data to the processor 37 are separated. The processor 37 in the exemplary embodiment also works as a memory controller. Further, the memory controller of the second exemplary embodiment 2 adjusts transmission timing of write data, and advances the writing latency by 1 clock cycle from that of the first exemplary embodiment.

Between the stacked memory and the processor chip 14, a command bus (CMD) 38 and an address bus (ADR) 39 are provided, which is the same as the first exemplary embodiment. An active command ACT which activates each bank, a read command which commands reading, and a write command which commands writing, are transferred in one direction from the processor 37 to the stacked memory, and are transmitted to all banks A to H through the command bus 38. As with the commands, address information is also transferred in one direction from the processor 37 to the stacked memory, and are transmitted to all banks A to H through the address bus 39.

Figure 9:
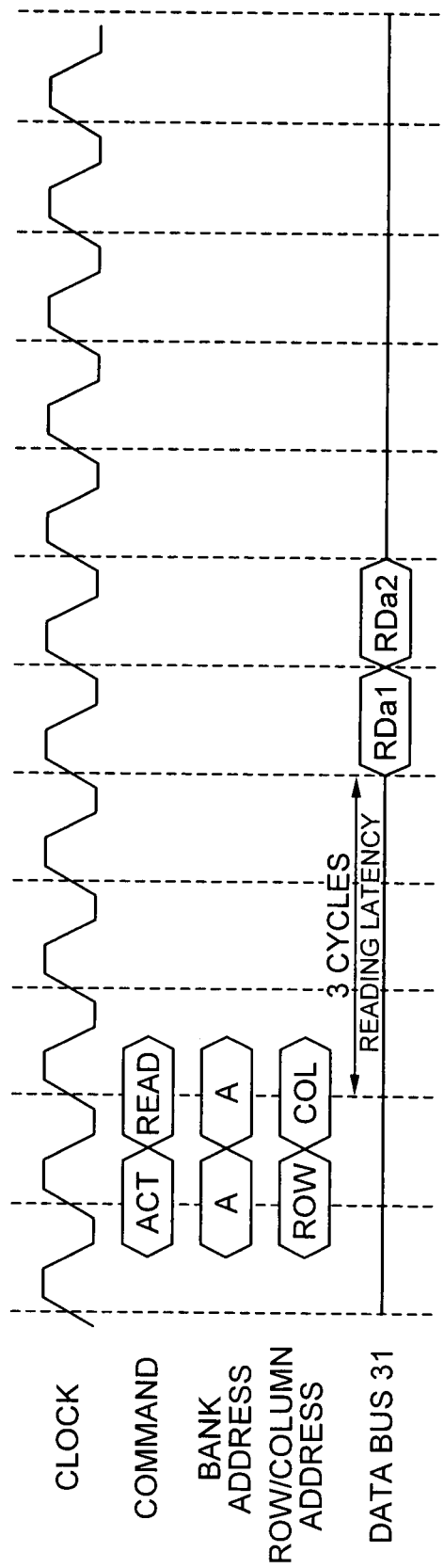
FIG. 9 illustrates an operating mode of reading data according to the second exemplary embodiment.

Next, each operating mode between the stacked memory and the processor chip will be described. FIG. 9 shows an operating mode of reading data performed to the memory cell in the bank A of the DRAM chip 28 of the stacked memory shown in FIG. 8.

First, the processor 37 transmits an active command ACT for activating the bank A, and signals of a bank address A for designating the bank A and a row address ROW to the stacked memory. Then, the processor 37 transmits a read command READ, and signals of the bank address A and column address COL to the stacked memory. When the DRAM chip 28 receives the signals from the processor 37, the DRAM chip 28 reads 16-bit data RDa1 and 16-bit data RDa2 from the 32-bit memory cell designated by the address in the bank A, with the burst length being 2, after three clock cycles, and continuously outputs them to the data bus 31 through the sub data bus 40. The data output from the DRAM chip 28 to the data bus 31 is input to the processor 37 in the next clock cycle.

Figure 10:
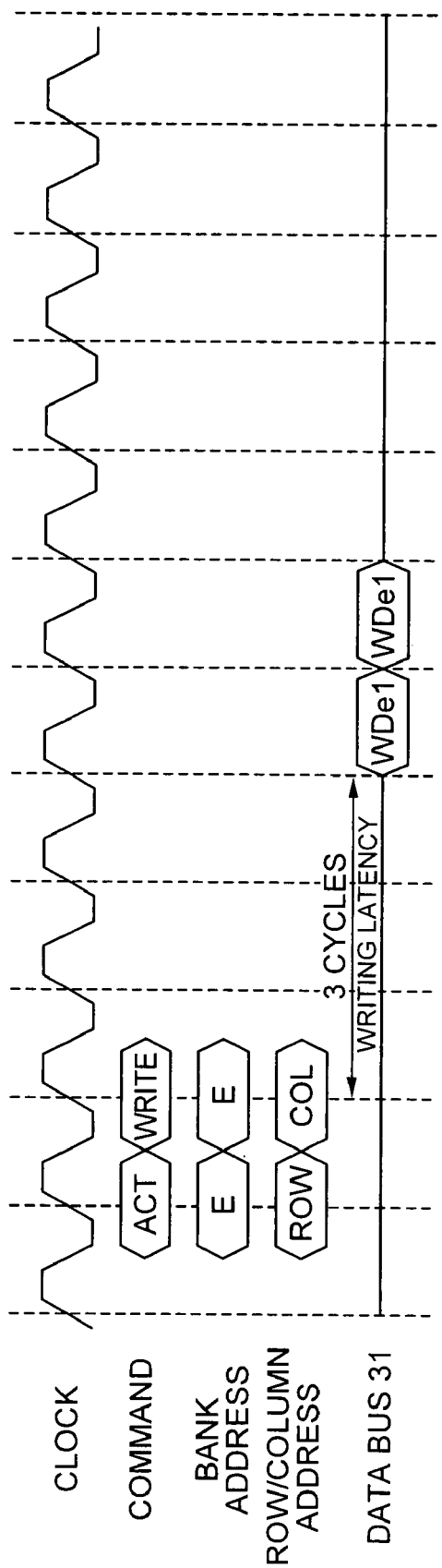
FIG. 10 illustrates an operation mode of writing data according to the second exemplary embodiment.

FIG. 10 shows an operating mode of data writing performed to a memory cell in the bank E of the DRAM chip 29 of the stacked memory shown in FIG. 8. First, the processor 37 transmits an active command ACT for activating the bank E, and signals of a bank address E for designating the bank E and a row address ROW to the stacked memory. Then, the processor 37 transmits a write command WRITE, and signals of the bank address E and a column address COL to the stacked memory. Further, after 3 clock cycles, the processor 37 continuously transmits 16-bit data WDe1 and 16-bit data WDe2, with the burst length being 2, to the bank E of the DRAM chip 29 through the data bus 31, as 32-bit write data for writing to the bank E.

The numbers of cycles is corresponded to the three cycles of reading latency from issuance of a command in a reading operation up to the time that the read data is transmitted to the data bus shown in FIG. 9. In the general capacity of a bank circuit, the appropriate writing latency is 4, as shown in FIG. 6 of the first exemplary embodiment, when taking into account a preparation time required to start writing data to a memory cell after receiving a write command. However, in the second exemplary embodiment, the memory controller in the processor adjusts the transmission timing of write data so as to advance the writing latency by one clock cycle such that the reading latency and the writing latency of data through the data bus become equal.

Now, the reading latency and writing latency in a general-purpose DRAM will be described. A reading latency means a period from the time that a read command is input to a DRAM up to the time that read data is output to the outside from the input-output buffer of the DRAM. A writing latency means a period from the time that a write command is input to a DRAM up to the time that write data is input from the outside to the input-output buffer. A general-purpose DRAM has an input-output buffer which is not provided to the stacked memory of the exemplary embodiment, so the data reading latency is longer than the data writing latency due to the process performed in the input-output buffer when the data pass through the input-output buffer. Therefore, the reading latency is typically longer than the writing latency.

In the case of setting the reading latency and the writing latency to be equal in a general-purpose DRAM, at the time of reading data, if the reading latency is four clock cycles in which processing performed by the input-output buffer is assumed to take one clock cycle, it is necessary to set the writing latency to be 4 clock cycles even if the writing latency is shorter, that is, three clock cycles for example, in data reading, for setting these latencies to be equal.

Even in the semiconductor device of the first exemplary embodiment, an input-output buffer is not provided to the input-output unit with a data bus in a memory chip, which is the same as the second exemplary embodiment. This is also the case in third to seventh exemplary embodiments which will be described later. In each of the semiconductor devices according to the first to seventh exemplary embodiments, memory chips are stacked on a logic chip, the distance between two chips is shorter than a general-purpose one, and there is no need to provide an input-output buffer. The reading latency according to the first and second exemplary embodiments has three clock cycles as shown in FIGS. 5 and 9, which is shorter by one clock cycle for input-output buffer processing, compared with the general-purpose one.

On the other hand, assuming that a period from the time that a command is input up to the time that data passes through the data bus of the via wire 102 located just proximal to the bank is defined as a latency, the reading latency (three clock cycles) becomes shorter than the writing latency (four clock cycles), as shown in FIGS. 5 and 6. Therefore, in the exemplary embodiment, the writing latency is advanced by one clock cycle as shown in FIG. 10 in order to prevent collision of read data and write data in the same data bus.

However, the writing latency is delayed by one cycle at the register 45 in the sub data bus 43 for writing, before write data is transmitted from the data bus 31 to the bank E. This is because the period from the time of receiving a write command up to the time of receiving the write data in the bank is set to be the same as the case of a bank in a general-purpose DRAM which is not a stacked memory. Thereby, the timing in the bank circuit does not change, so there is no need to redesign the bank circuit of a stacked memory.

Figure 11:
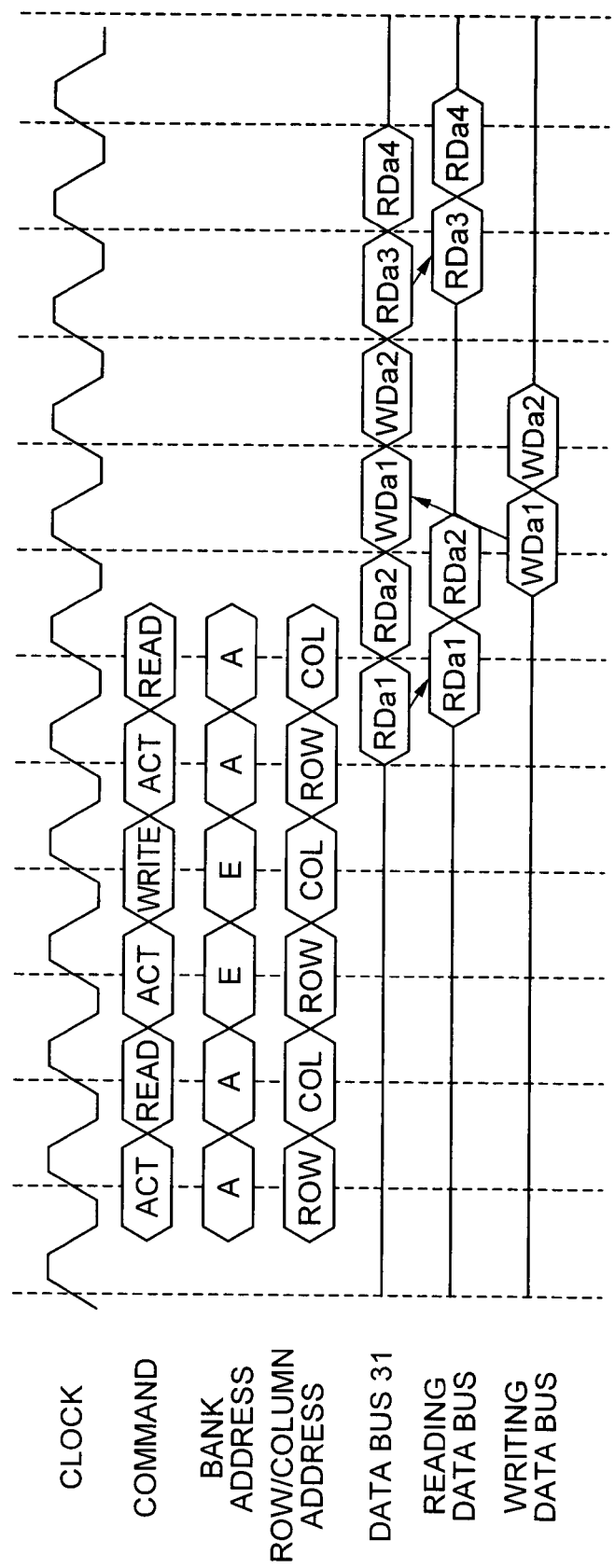
FIG. 11 illustrates an operating mode of bank interleaving for reading and writing according to the second exemplary embodiment.

FIG. 11 shows an interleaving operation mode of reading or writing performed to a plurality of banks which share a data bus.

The processor 37 issues an active command ACT and a read command READ to the bank A in the DRAM chip 28 of the stacked memory shown in FIG. 8. Then, the processor 37 issues an active command ACT and a write command WRITE to the bank E in the DRAM chip 29 of the stacked memory. Then, the processor 37 outputs write data WDe1 and WDe2 for the bank E to the data bus 31 after three clock cycles from the issuance of the write command. Further, the processor 37 issues an active command ACT and a read command READ to the bank A. Note that outputting signals of row address ROW and column address COL to each bank is the same as the cases of FIGS. 9 and 10.

When the bank A of the DRAM chip 28 receives the commands and the address signals from the processor 37, the bank A performs reading operation, and outputs read data RDa1 and RDa2 to the processor 37 through the data bus 31 after three clock cycles from the issuance of the commands. Then, the bank E of the DRAM chip 29 receives the commands and the address signal from the processor 37, and when receiving the write data WDe1 and WDe2, the bank E performs writing operation of the received data. Further, when the bank A receives the commands and the address signals from the processor 37, the bank A performs reading operation, and outputs the read data RDa3 and RDa4 to the processor 37 through the data bus 31 after three clock cycles from the issuance of the commands.

In the semiconductor device of the exemplary embodiment, read data and write data in the same data bus are exchanged between the bank and the processor 37 without colliding with each other on the data bus. Therefore, no waiting time is caused between issuance of a read command and issuance of a write command in the processor.

Further, since it is possible to continuously issue a read command and a write command in the same manner as the first exemplary embodiment to a plurality of banks including different buses, an interleaving operation can be performed by continuously issuing a read command and a write command while switching them, to all banks of the stacked memory.

Although, in the exemplary embodiment, at the time of writing, transmission of write data to the data bus after issuance of a write command is performed earlier compared with a general-purpose one in order to make the reading latency and the writing latency equal, it is also possible to switch reading and writing continuously by providing a register to a sub data bus for reading and delaying transmission of read data from the bank to the data bus by predetermined cycles after issuance of a read command when reading, while preventing data collision on the data bus.

Further, although writing latency is larger than reading latency due to the performance of the original bank circuits in the exemplary embodiment, if the bank circuit is changed, reading latency may be larger than writing latency. In such a case, by delaying transmission of write data to the data bus by predetermined cycles at the time of writing, switching between reading and writing can be performed continuously while preventing data collision on the data bus.

Further, although the stacked memory includes two memory chips which are stacked in the present invention, the same operation can be performed with only one chip or with a stacked memory in which three or more chips are stacked. Further, although the exemplary embodiment has a configuration in which a stacked memory is stacked on a processor chip, the same operation can be performed in the case that a stacked memory and a processor chip are distant, so that communications are performed between them through wires on the board.

Further, although a via wire is used for inter-chip connection of a data bus, bump or a bonding wire may be used.

Third Exemplary Embodiment

A variation of the second exemplary embodiment shown in FIG. 8 will be described as a third exemplary embodiment.

Figure 12:
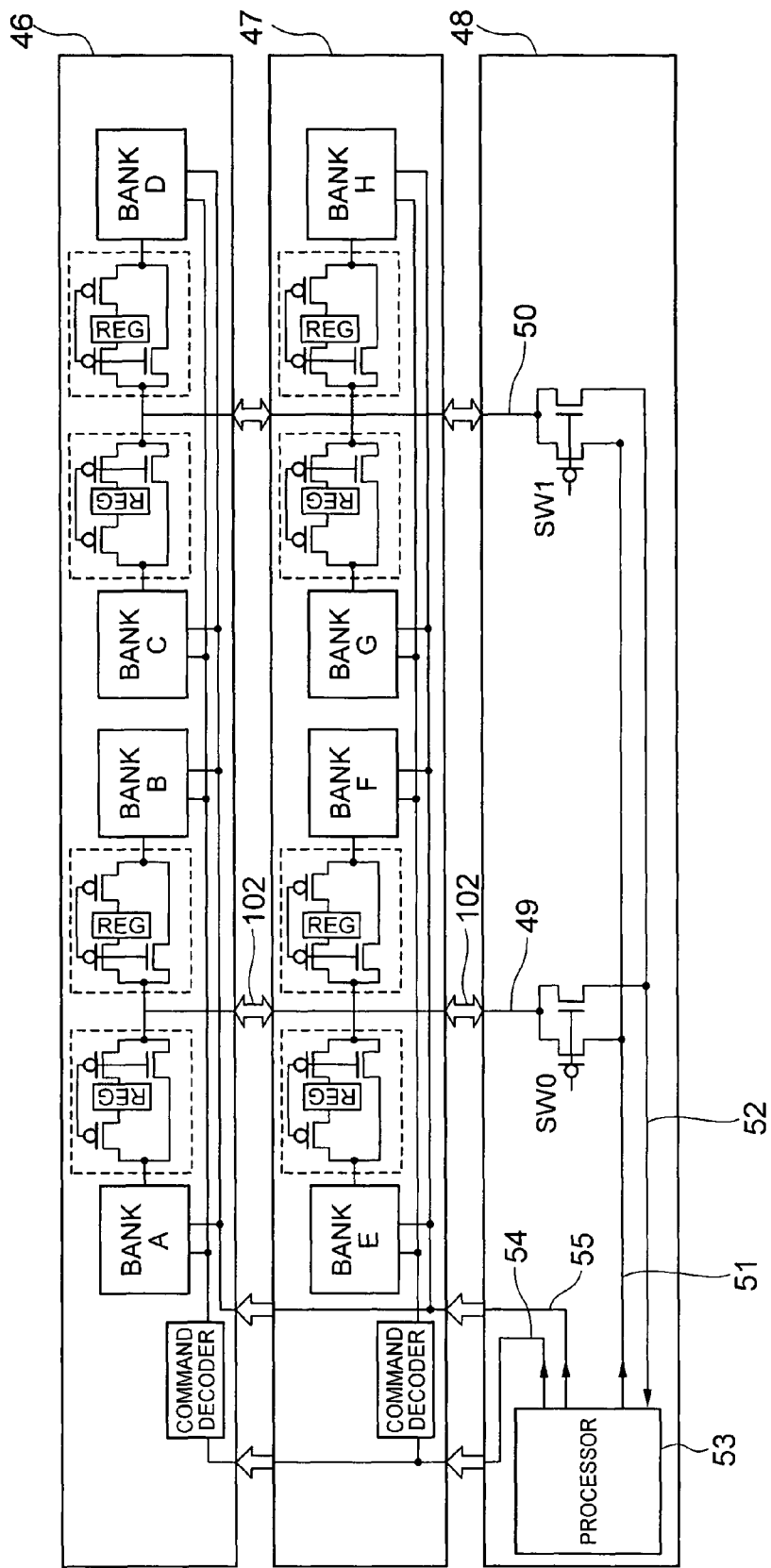
FIG. 12 is a schematic diagram showing a stacked-type semiconductor device including a stacked memory and a processor chip according to a third exemplary embodiment.

Referring to FIG. 12, a semiconductor device according to the third exemplary embodiment includes a stacked memory, and a processor chip 48 which is a logic chip including a processor 53. The stacked memory includes a DRAM chip 46 and a DRAM chip 47 which are stacked, and each DRAM chip has four banks. As with the bank shown in FIG. 4, each bank includes a 256M-bit memory cell array 24, an address latch 25, and address decoders such as a row decoder 26 and a column decoder 27. Therefore, each bank can perform writing and reading operations independently.

As shown in FIG. 12, in the exemplary embodiment, a bank A and a bank B shear a data bus 49, and a bank C and a bank D share a data bus 50, in the DRAM chip 46. In the DRAM chip 47, a bank E and a bank F share a data bus 49, and a bank G and bank H share a data bus 50. Since it is limited that adjacent banks share a bus, there is no need to use a long wire for a data bus in a chip. Between the stacked DRAM chips, the banks A and B and the banks E and F share the data bus 49, and the banks C and D and the banks G and H share the data bus 50, respectively.

As in the case of the first exemplary embodiment, a via wire 102, which is a wire penetrating a chip, is used for inter-chip connection of a data bus. However, since the diameter of the via wire 102 is as large as 20 μm so that it is difficult to increase the wiring density, a data bus including the via wire 102 is a bidirectional bus which can be used for both read data and write data. In this exemplary embodiment, two adjacent banks share a data bus, so the number of data buses can be a half the number of those used in the second exemplary embodiment.

The stacked memory and the processor chip 48 are connected via two data buses 49 and 50. In the processor chip 48, selector switches SW0 and SW1 are provided. Each of the data buses 49 and 50 is connected to a writing data bus (WDB) 51 or a reading data bus (RDB) via a selector switch corresponding to a command issued. By providing two buses in the processor chip 48, input and output of write data from the processor 53 and read data to the processor 53 are separated. The processor 53 of this exemplary embodiment also works as a memory controller which is the same as that of the second exemplary embodiment.

Since the operating modes of the semiconductor device according to this exemplary embodiment are same as those of the second exemplary embodiment 2, the detailed description is not given in this exemplary embodiment.

In the semiconductor device of the exemplary embodiment, banks which share a data bus, regardless of adjacent banks in a chip or banks in different chips, can exchange data with the processor 53 without causing collision on the data bus by making the reading latency and the writing latency equal, which is the same as the second exemplary embodiment. Therefore, no waiting time is caused between issuance of a read command and issuance of a write command in the processor 53.

As in the case of the second exemplary embodiment, a DRAM chip includes, between the banks and the data buses, a sub data bus for transmitting write data, a sub data bus for transmitting read data, and a register, connected to the sub data bus for writing, for delaying only write data by predetermined cycles. This is for making a period from the time of receiving a write command to the time of receiving a write data in the bank equal to that of the case of a bank in a general-purpose DRAM chip which is not a stacked memory. Thereby, there is no need to redesign the bank circuit of a stacked memory because timing in the bank circuit will not change.

Further, between banks including different data buses, a read command and a write command can be issued continuously, as in the case of the first exemplary embodiment. Therefore, switching between reading and writing can be performed continuously to all banks of the stacked memory.

Although two adjacent banks share a data bus in a chip in the exemplary embodiment, if three or more banks are provided around a data bus, they may share the data bus.

Fourth Exemplary Embodiment

Another variation of the second exemplary embodiment shown in FIG. 8 will be described as a fourth exemplary embodiment.

Figure 13:
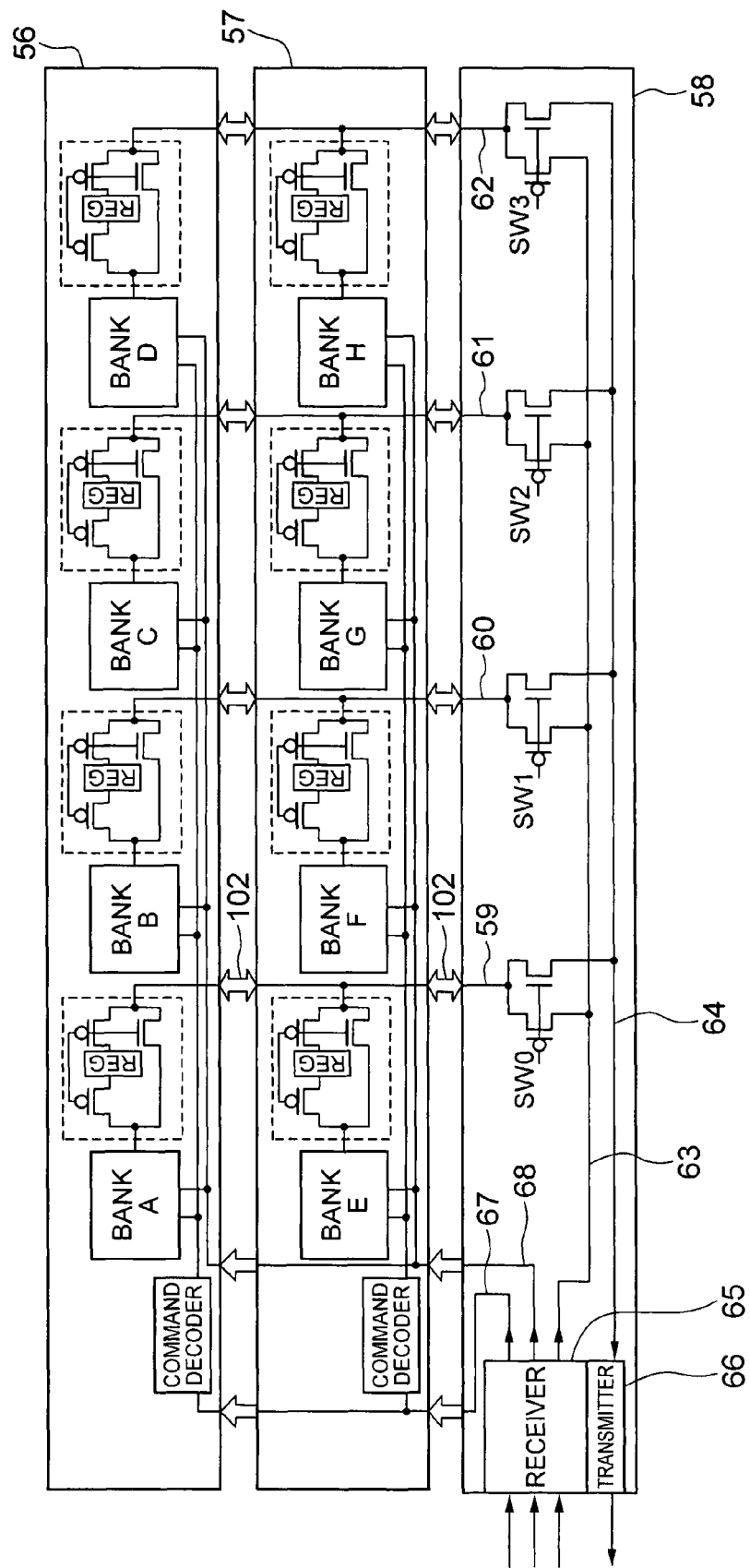
FIG. 13 is a schematic diagram showing a stacked-type semiconductor device including a stacked memory and an interface chip according to a fourth exemplary embodiment.

Referring to FIG. 13, the semiconductor device according to the exemplary embodiment includes a stacked memory and an interface chip 58 which is a logic chip including an interface function with the outside of the chip.

The stacked memory includes a DRAM chip 56 and a DRAM chip 57 which are stacked, and each DRAM chip has four banks. As shown in FIG. 4, each bank has a 256M-bit memory cell array 24, an address latch 25, and address decoders including a row decoder 26 and a column decoder 27. Therefore, each bank can perform writing and reading operations independently.

As shown in FIG. 13, in the stacked DRAM chips, a bank A and a bank E share a data bus 59, a bank B and a bank F share a data bus 60, a bank C and a bank G share a data bus 61, and a bank D and a bank H share a data bus 62.

As in the case of the first exemplary embodiment, a via wire 102 which is a wire penetrating chips is used for inter-chip connection of a data bus. However, since the diameter of the via wire 102 is as large as 20 μm so that it is difficult to increase the wiring density, a data bus including the via wire 102 is a bidirectional bus which can be used for both read data and write data.

The stacked memory and the interface chip 58 are connected via four data buses 59 to 62. In the interface chip 58, one of the data buses 59 to 62 is connected to a writing data bus (WDB) 63 or a reading data bus (RDB) via a selector switch corresponding to a command received from the outside.

The interface chip 58 has a high-speed interface unit 105 exceeding Gb/s for communicating with a processor or a memory controller provided outside. The high-speed interface unit 105 includes a transmitter 66 which transmits data to the outside, and a receiver 65 which receives data from the outside. Since transmission paths are separated for transmission and reception of data, write data and read data are communicated separately.

In the semiconductor device of the exemplary embodiment, when a read command and a write command are received continuously by the receiver 65 of the high-speed interface unit 105 from the outside of the interface chip 58, if the read destination bank and the write destination bank are to be connected to different data buses respectively, data is exchanged while the reading data bus 64 and the writing data bus 63 in the interface chip 58 are connected to different data buses respectively, so no collision is caused between the read data and the write data.

If the read destination bank and the write destination bank are to be connected to the same data bus, data collision on the data bus can be prevented by making the reading latency and the writing latency from the time of issuing a command in the receiver 65 of the high-speed interface 105 to the time that the data passes through the data bus equal. Therefore, it is possible to perform reading and writing operation in an interleaving manner without causing a waiting time to different banks of the stacked memory. In such a case, since the operating mode is the same as that of the second exemplary embodiment, the detailed description is not given in this exemplary embodiment. A DRAM chip includes, between the banks and the data buses, a sub data bus for transmitting write data, a sub data bus for transmitting read data, and a register for delaying only write data by predetermined cycles which is connected to the sub data bus for writing, which is the same as that of the second exemplary embodiment. This is provided for making a period from the time of receiving a write command to the time of receiving write data in the bank equal to that of the case of a bank in a general-purpose DRAM chip which is not a stacked memory. Thereby, there is no need to redesign a bank circuit of a stacked memory, because timing in the bank circuits will not change.

Although the interface chip is a logic chip including an interface with the outside in the exemplary embodiment, a memory chip with an interface, which includes both an interface with the outside and memory banks, may be used instead.

Fifth Exemplary Embodiment

Another variation of the second exemplary embodiment 2 shown in FIG. 8 will be described as a fifth exemplary embodiment.

Figure 14:
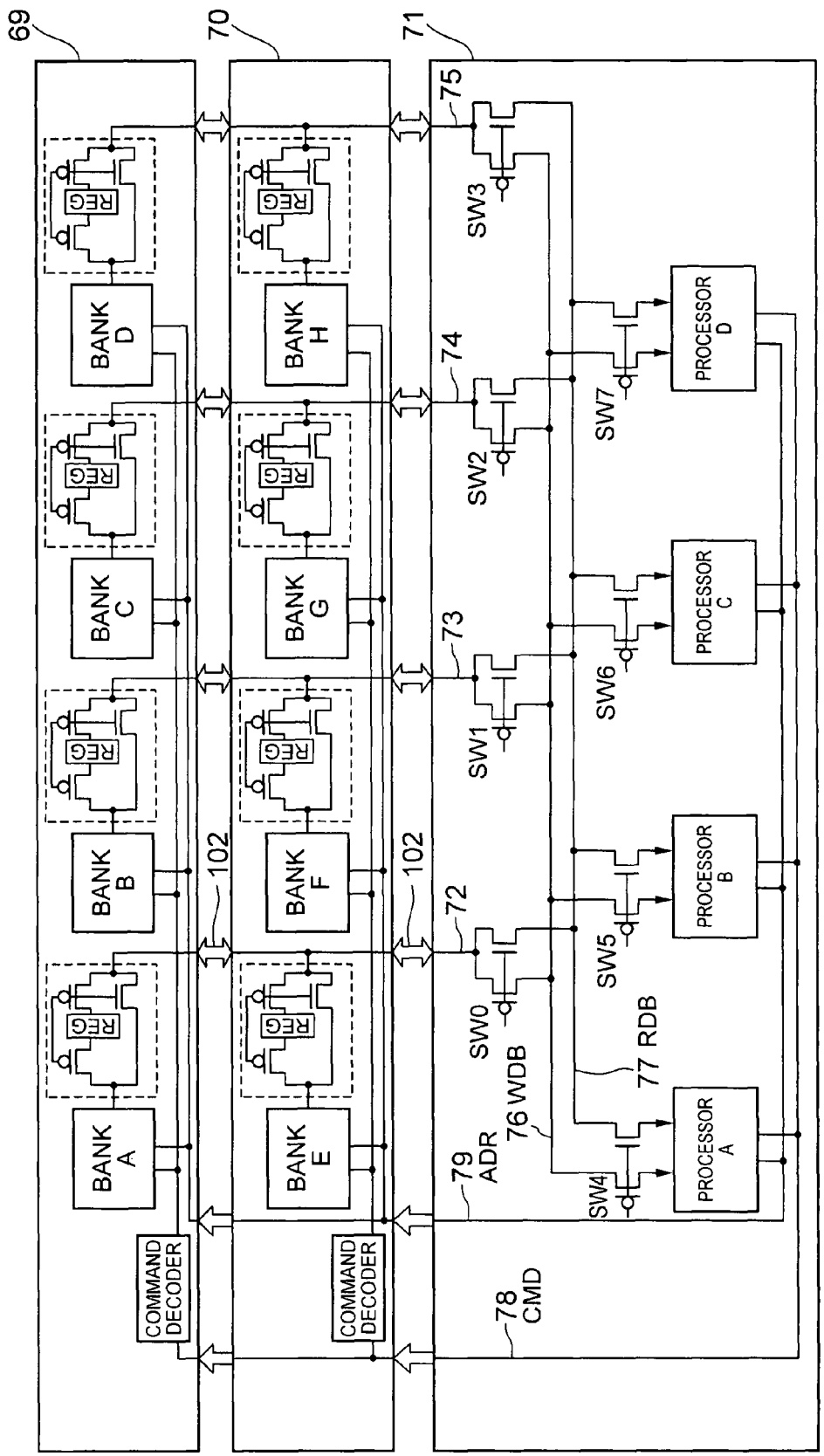
FIG. 14 is a schematic diagram showing a stacked-type semiconductor device including a stacked memory and a multi-core processor chip according to a fifth exemplary embodiment.

Referring to FIG. 14, the semiconductor device of the exemplary embodiment includes a stacked memory, and a multi-core processor chip 71 which is a logic chip including a plurality of processors.

The stacked memory includes a DRAM chip 69 and a DRAM chip 70 which are stacked, and a DRAM chip has four banks. As with the bank shown in FIG. 4, each bank has a 256M-bit memory cell array 24, an address latch 25, and address decoders including a row decoder 26 and a column decoder 27. Therefore, each bank can perform writing and reading operations independently.

As shown in FIG. 14, in the stacked DRAM chips, a bank A and a bank E share a data bus 72, a bank B and a bank F share a data bus 73, a bank C and a bank G share a data bus 74, and a bank D and a bank H share a data bus 75. Banks in a DRAM chip do not share a data bus in order to prevent a global long wire which causes a delay in data transfer.

As in the case of the first exemplary embodiment, a via wire 102 which is a wire penetrating a chip is used for inter-chip connection of a data bus. However, since the diameter of the via wire 102 is as large as 20 μm so that it is difficult to increase the wiring density, a data bus including the via wire 102 is a bidirectional bus which can be used for both read data and write data.

The multi-core processor chip 71 is configured such that four processors A to D are integrated in one chip. With a plurality of processors, signal processing is allocated to and performed by the respective processors, so that the computation capacity is increased. Each of the processors has a memory controller function which is the same as that of the second exemplary embodiment.

The stacked memory and the multi-core processor chip 71 are connected via four data buses 72 to 75. The multi-core processor chip 71 has selector switches SW0 to SW3. Corresponding to a command issued, one of the data buses 72 to 75 is connected to the writing data bus (WDB) 76 or the reading data bus (RDB) 77 via one of the selector switches. Further, the multi-core processor chip 71 has selector switches SW4 to SW7, and a processor which issues a command, among the processors A to D, is connected to the writing data bus 76 or the reading data bus 77 via one of the selector switches corresponding to the type of the command. Each processor is connectable to either the reading data bus 76 or the writing data bus 77, so it can exchange data with any of the banks of the stacked memory.

The operating modes between the respective processors A to D and the stacked memory of the semiconductor device according of this exemplary embodiment are same as those of the second exemplary embodiment, so the detailed description is not given in this exemplary embodiment.

Since respective processors are connected to the writing data bus 76 or the reading data bus 77 while sharing them, regulation is needed in order to prevent bus confliction with another processor when accessing to the memory, but it is possible to continuously issuing a read command and a write command while switching them. For example, after the processor A issues a read command to the stacked memory, the processor A can issue a write command continuously. This is because data can be exchanged with the processor without collision on the data bus by making the reading latency and the writing latency equal in the same manner as that of the second exemplary embodiment for a bank of another chip sharing the data bus, so no waiting time is caused between issuance of the read command and issuance of the write command in the processor.

As in the case of the second exemplary embodiment, a DRAM chip includes, between the banks and the data buses, a sub data bus for transmitting write data, a sub data bus for transmitting read data, and a register, which is connected to the sub data bus for writing, for delaying transmission of only write data by predetermined cycles. This is for making the period from the time of receiving a write command to the time of receiving write data in the bank equal to that of the case of a bank in a general-purpose DRAM chip which is not a stacked memory. Thereby, there is no need to redesign a bank circuit of a stacked memory, since the timing in the bank circuit will not change.

Further, it is also possible to issue a read command and a write command continuously while switching them between different processors. For example, after the processor A issues a read command, the processor B can continuously issue a write command.

Further, if the read destination bank and the write destination bank are connected to different data buses, read data and write data will not collide with each other on a data bus even the read command and the write command are continuously issued while being switched. Therefore, it is possible to perform reading and writing operations in an interleaving manner to different banks in the stacked memory without causing a waiting time.

Although four processors are provided in the exemplary embodiment, the same operation can be performed with two or more processors.

Sixth Exemplary Embodiment

Another variation of the second exemplary embodiment shown in FIG. 8 will be described as a sixth exemplary embodiment.

Figure 15:
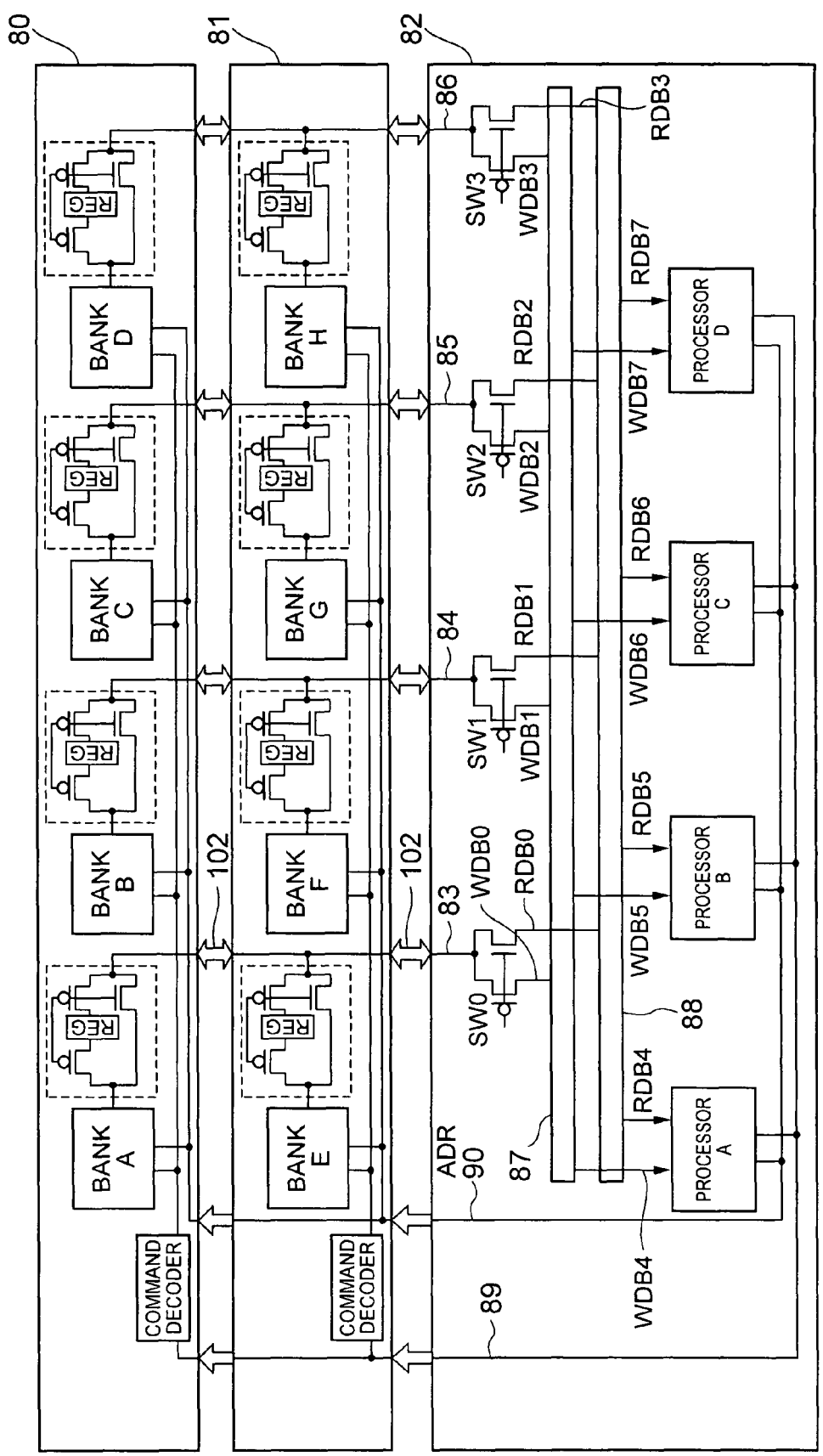
FIG. 15 is a schematic diagram showing a stacked-type semiconductor device including a stacked memory and a multi-core processor chip according to a sixth exemplary embodiment.

Referring to FIG. 15, a semiconductor device of the exemplary embodiment includes a stacked memory, and a multi-core processor chip 82 which is a logic chip including a plurality of processors. The stacked memory includes a DRAM chip 80 and a DRAM chip 81 which are stacked, and each DRAM chip has four banks. As with the bank shown in FIG. 4, each bank has a 256M-bit memory cell array 24, an address latch 25, and address decoders including a row decoder 26 and a column decoder 27. Therefore, each bank can perform reading and writing operations independently.

As shown in FIG. 15, a bank A and a bank E share a data bus 83, a bank B and a bank F share a data bus 84, a bank C and a bank G share a data bus 85, and a bank D and a bank H share a data bus 86, in the stacked DRAM chips. Banks in a DRAM chip do not share a data bus in order to avoid a global long wiring which causes a delay in data transfer.

A via wire 102 which is a wire penetrating chips is used for inter-chip connection of a data bus. However, since the diameter of the via wire 102 is as large as 20 μm so that it is difficult to increase the wiring density, a data bus including the via wire 102 is a bidirectional bus which can be used for both read data and write data.

The multi-core processor chip 82 is configured such that four processors A to D are integrated in one chip. With a plurality of processors, signal processing is allocated to and performed by the respective processors in parallel, so that the computation capacity is increased. Each of the processors has a memory controller function which is the same as that of the second exemplary embodiment.

The stacked memory and the multi-core processor chip 82 are connected via four data buses 83 to 86. In the multi-core processor chip 82, the data buses 83 to 86 are connected to a crossbar switch 87 for write data and a crossbar switch 88 for read data.

Specifically, the data bus 83 is connected to the crossbar switch 87 via the sub data bus WDB0, and is connected to the cross bar switch 88 via a sub data bus RDB0. The data bus 84 is connected to the crossbar switch 87 via a sub data bus WDB1, and is connected to the crossbar switch 88 via a sub data bus RDB1. The data bus 85 is connected to the crossbar switch 87 via a sub data bus WDB2, and is connected to the crossbar switch 88 via a sub data bus RDB2. The data bus 86 is connected to the crossbar switch 87 via a sub data bus WDB3, and is connected to the crossbar switch 88 via a sub data bus RDB3.

On the other hand, the four processors A to D are also connected to the two crossbar switches. Specifically, the processor A is connected to the crossbar switch 87 via a sub data bus WDB4, and is connected to the crossbar switch 88 via a sub data bus RDB4. The processor B is connected to the crossbar switch 87 via a sub data bus WDB5, and is connected to the crossbar switch 88 via a sub data bus RDB5. The processor C is connected to the crossbar switch 87 via a sub data bus WDB6, and is connected to the crossbar switch 88 via a sub data bus RDB6. The processor D is connected to the crossbar switch 87 via a sub data bus WDB7, and is connected to the crossbar switch 88 via a sub data bus RDB7.

Next, the crossbar switches 87 and 88 will be described. FIG. 16 is a schematic diagram showing crossbar switches of 4 by 4.

A switch for selecting a connection between wires is provided at a bullet part where a wire from a data bus and a wire from a processor cross each other. With the crossbar switches, when one processor is accessing one data bus, another processor can access another data bus. In such a case, four processors can access four different data buses respectively at the same time, so data transfer with the stacked memory can be improved up to four times.

However, in a configuration in which all banks share a command bus and a address bus, it is needed to increase the transfer speed between a command bus (CMD) 89 and an address bus (ADR) 90 as fast as four times, or increase the number of wires of the bus as large as four times. Alternatively, for commands and addresses, it is also acceptable to switch connections between processors and banks by using crossbar switches in the same manner as those for the data buses.

As in the case of the second exemplary embodiment, a DRAM chip includes a sub data bus for transmitting write data, a sub data bus for transmitting read data, and a register, which is connected to the sub data bus for writing, for delaying only write data by predetermined cycles. Since the operations of these components are the same as those of the second exemplary embodiment, the detailed description thereof is not given in this exemplary embodiment.

The operating modes of the semiconductor device according to the exemplary embodiment between the respective processors A to D and the stacked memory are the same as those of the second exemplary embodiment, so the detailed description thereof is not given in this exemplary embodiment.

In the semiconductor device of the exemplary embodiment, with the crossbar switches being used for a method of selectively connecting data buses, it is possible to perform bank interleaving operation while issuing a read command and a write command from one processor by switching them continuously. However, regulation is needed such that two or more processors do not access one data bus simultaneously.

Although four processors are connected to the crossbar switches in the exemplary embodiment, the same operation can be performed with two or more processors.

Seventh Exemplary Embodiment

A variation of the semiconductor device of the sixth exemplary embodiment shown in FIG. 15 will be described as a seventh exemplary embodiment.

Figure 17:
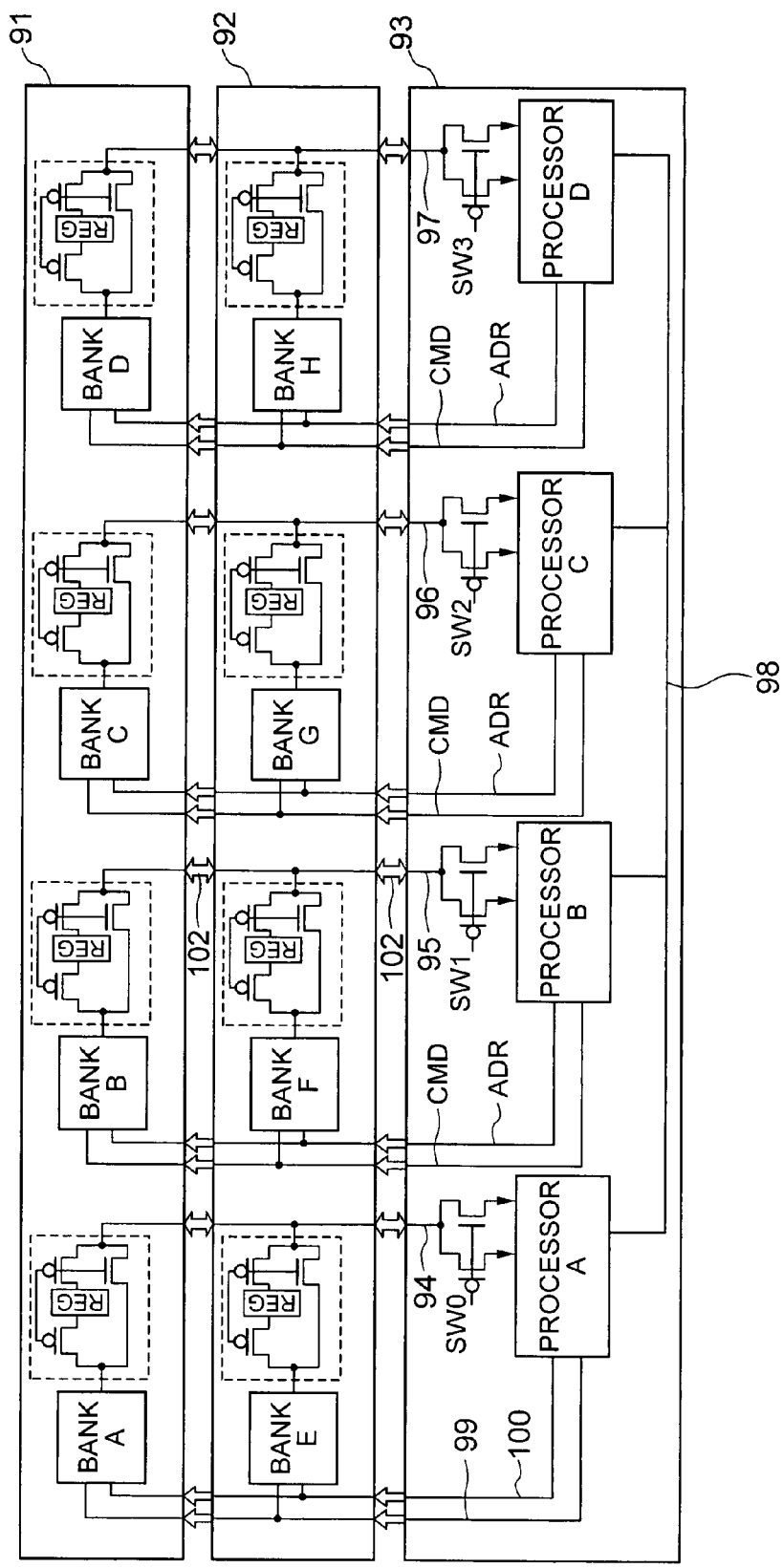
FIG. 17 is a schematic diagram showing a stacked-type semiconductor device including a stacked memory and a multi-core processor chip according to a seventh exemplary embodiment.
Figure 18:
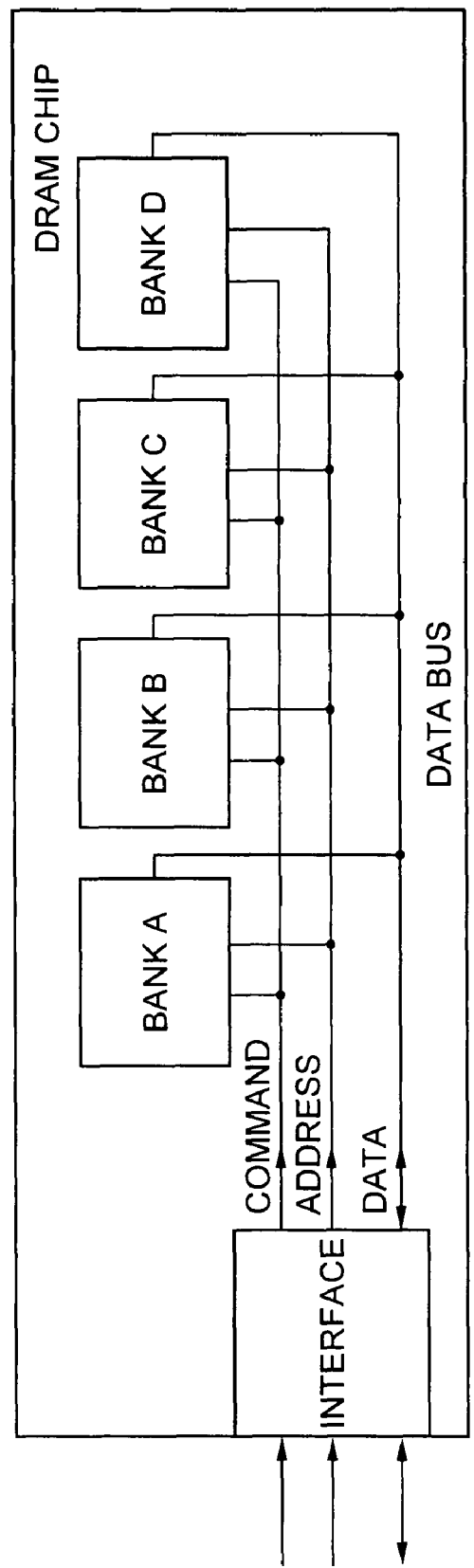
FIG. 18 is a schematic diagram showing a related DRAM chip.
Figure 19:
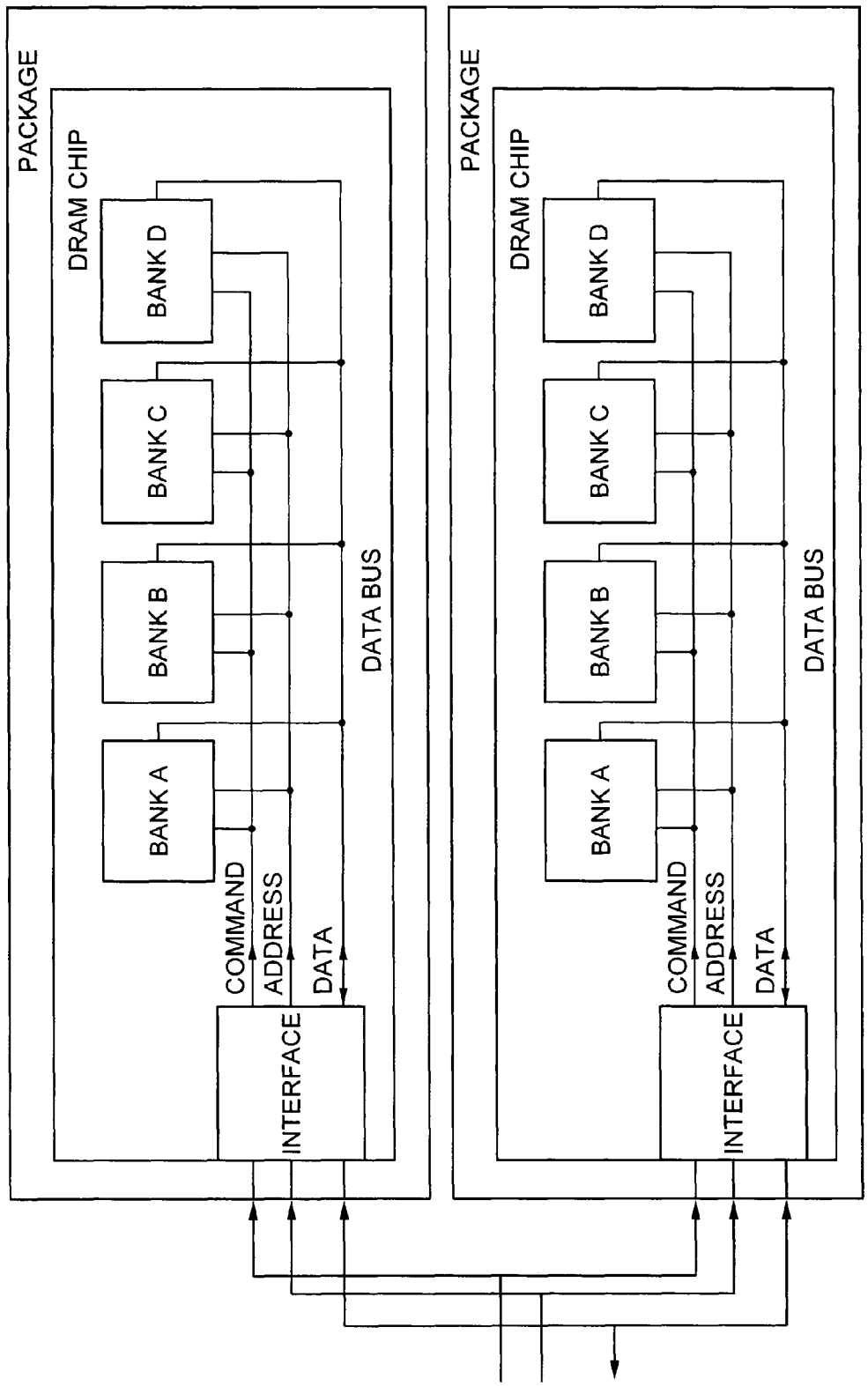
FIG. 19 is a schematic diagram showing a device configuration in which related two DRAMs are provided.

Referring to FIG. 17, a semiconductor device of the exemplary embodiment includes a stacked memory and a multi-core processor chip 93 which is a logic chip including a plurality of processors. The stacked memory includes a DRAM chip 91 and a DRAM chip 92 which are stacked, and each DRAM chip has four banks. As with the bank shown in FIG. 4, each bank has a 256M-bit memory cell array 24, an address latch 25, and address decoders such as a row decoder 26 and a column decoder 27, so each bank can perform reading and writing operations independently.

As shown in FIG. 17, a bank A and a bank E share a data bus 94, a bank B and a bank F share a data bus 95, a bank C and a bank G share a data bus 96, a bank D and a bank H share a data bus 97, in the stacked DAM chips. Banks in a DRAM chip do not share a data bus in order to avoid a global long wiring which causes a delay in data transfer.

A via wire 102 which is a wire penetrating chips is used for inter-chip connection of a data bus. However, since the diameter of the via wire 102 is as large as 20 μm so that it is difficult to increase the wiring density, a data bus including the via wire 102 is a bidirectional bus which can be used for both read data and write data.

The multi-core processor chip 93 is configured such that four processors A to D are integrated in one chip. With a plurality of processors, signal processing is allocated to and performed by respective processors in parallel, so that the computation capacity is increased. Each of the processors has a memory controller function which is the same as that of the second exemplary embodiment.

The stacked memory and the multi-core processor chip 93 are connected via four data buses 94 to 97. In the exemplary embodiment, each data bus is connected to one processor in the multi-core processor chip 93. The processors are connected via a shared bus 98. The processor A independently includes a command bus (CMD) 99 and an address bus (ADR) 100, and the buses are connected to the bank A and the bank E. As the processor A, each of the other processors B to D includes a command bus and an address bus.

In this configuration, an area of the stacked memory where one processor can directly access is limited to a bank which shares a data bus connected to the processor. In the case that one processor attempts to access a bank which is directly connected to another processor, the processor accesses the bank via the shared bus 98 which is shared by the processors.

Further, as in the case of the second exemplary embodiment, a DRAM chip includes, between the banks and the data buses, a sub data bus for transmitting write data, a sub data bus for transmitting read data, and a register, which is connected to the sub data bus for writing, for delaying only write data by predetermined cycles. Operations with these configurations are the same as those of the second exemplary embodiment, so the detailed description thereof is not given in this exemplary embodiment.

In the operating modes of the semiconductor device according to this exemplary embodiment, operations of each of the processors A to D and the stacked memory are the same as those of the second exemplary embodiment, so the detailed description thereof is not given in this exemplary embodiment.

In the semiconductor device of the exemplary embodiment, when a processor issues a read command and a write command continuously while switching them to banks of different chips which share a data bus, read data and write data will not collide with each other on a data bus by adjusting the reading latency from the time of issuing a read command to the time that read data is transmitted to the data bus and the writing latency from the time of issuing a write command to the time that write data is transmitted to the data bus such that they become equal. Therefore, it is possible to interleave reading and writing operations continuously between banks sharing a data bus.

Further, since each processor has a command bus and an address bus to banks sharing a data bus in the exemplary embodiment, each processor can independently exchange data with a memory area where it can access directly.

Each of the third to seventh exemplary embodiments has a configuration in which two sub data buses and a register are provided between a bank and a data bus, which is same as the second exemplary embodiment. These are provided in order to make a period from the time that a bank in a DRAM chip receives a write command to the time that the chip receives write data equal to the period of the case of a bank in a conventional DRAM chip which is not a stacked memory, when a processor controls to make the reading latency and the writing latency equal. However, these configurations may not be provided, as the case of the first exemplary embodiment.

Further, a logic chip may include a plurality of banks, besides a memory chip. In such a case, it is possible to reduce the number of stacked memory chips if the memory capacity required for the entire stacked-type semiconductor device is less than the capacities of two memory chips.

Further, a plurality of exemplary embodiments, among the first to seventh exemplary embodiments, may be combined.

The semiconductor device according to any one of the exemplary embodiments of the present invention is a semiconductor device including memory chips, in which data transfer between chips is performed while preventing collision of read data and write data on a data bus. In such a semiconductor chip, it is possible to perform bank interleaving operation by issuing read commands and write commands for all banks of the memory chips while switching them, without causing a waiting time.

Further, by applying any one of the exemplary embodiments of the present invention to a stacked-type semiconductor device in which memory chips are stacked and by using bidirectional data buses including via wires, the wiring length can be very short compared with a general-purpose one, so high-speed data transfer of 10 GHz cycle can be performed between the chips.

The stacked memory may be another memory such as an SRAM or a nonvolatile memory, rather than a DRAM.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A semiconductor device comprising:
   a memory chip including a plurality of banks;
   a logic chip which transmits a write command and write data to the memory chip, and transmits a read command to the memory chip and receives read data from the memory chip; and
   data buses, provided corresponding to the banks, for transmitting and receiving the write data and the read data between the banks and the logic chip, wherein
   the logic chip includes:
      a writing data bus for transmitting the write data to the memory chip via one of the data buses;
      a reading data bus for receiving the read data from the memory chip via one of the data buses; and
      a switch for, corresponding to a write command or a read command issued to one of the banks, connecting the writing data bus or the reading data bus to a data bus connected to the bank,
   wherein a plurality of memory chips are stacked, and banks in different memory chips share a data bus,
   wherein the logic chip makes a writing latency from a time of issuing the write command to one of the banks up to a time of transmitting the write data to the data bus and a reading latency from a time of issuing the read command up to a time that the bank transmits the read data to the data bus equal, to thereby issue the read command and the write command in continuing clock cycles.

2. The semiconductor device according to claim 1, further comprising a register, provided between the bank and the data bus, for delaying transmission of the write data or the read data by a predetermined clock cycle.

* * * * *